United States Patent
Richardson et al.

(10) Patent No.: US 10,981,800 B2
(45) Date of Patent: *Apr. 20, 2021

(54) CHAMBER ENCLOSURE AND/OR WAFER HOLDER FOR SYNTHESIS OF ZINC OXIDE

(71) Applicants: Seoul Semiconductor Co., Ltd., Ansan (KR); Solution Deposition Systems, Inc., Goleta, CA (US)

(72) Inventors: Jacob J. Richardson, Santa Barbara, CA (US); Evan C. O'Hara, Santa Barbara, CA (US)

(73) Assignee: Seoul Semiconductor Co., Ltd., Ansan (KR)

( * ) Notice: Subject to any disclaimer, the term of this patent is extended or adjusted under 35 U.S.C. 154(b) by 94 days.

This patent is subject to a terminal disclaimer.

(21) Appl. No.: 15/099,573

(22) Filed: Apr. 14, 2016

(65) Prior Publication Data

US 2017/0297920 A1    Oct. 19, 2017

(51) Int. Cl.
| | | |
|---|---|---|
| *C30B 19/06* | (2006.01) | |
| *C01G 9/02* | (2006.01) | |
| *B01J 19/00* | (2006.01) | |
| *C30B 35/00* | (2006.01) | |

(52) U.S. Cl.
CPC .............. *C01G 9/02* (2013.01); *B01J 19/00* (2013.01); *C30B 35/002* (2013.01)

(58) Field of Classification Search
CPC .. C30B 7/00; C30B 7/005; C30B 7/14; C30B 9/00; C30B 19/00; C30B 19/02; C30B 19/04; C30B 19/06; C30B 19/062; C30B 19/067; C30B 19/068; C30B 19/08; C30B 29/00; C30B 29/10; C30B 29/16; C30B 35/00; C30B 35/002; Y10T 117/00; Y10T 117/10; Y10T 117/1016; Y10T 117/1024; Y10T 117/102; C01G 9/02; B01J 19/00
USPC ....... 117/54, 56, 60, 68, 200, 204–206, 937, 117/944

See application file for complete search history.

(56) References Cited

U.S. PATENT DOCUMENTS

| | | | | |
|---|---|---|---|---|
| 2,990,256 A | * | 6/1961 | Lovins ...................... | C30B 7/00 117/202 |
| 4,667,076 A | * | 5/1987 | Amada .................... | C30B 25/10 219/753 |

(Continued)

FOREIGN PATENT DOCUMENTS

| | | |
|---|---|---|
| CN | 1334596 A | 2/2002 |
| CN | 102169939 A | 8/2011 |

(Continued)

OTHER PUBLICATIONS

Andeen, et al, "Crystal chemistry of epitaxial ZnOon (1 1 1) MgAl2O4 produced by hydrothermal synthesis," Journal of Crystal Growth, 259, doi:10.1016/S0022-0248(03)01589-6, 2003, pp. 103-109.

(Continued)

*Primary Examiner* — Kenneth A Bratland, Jr.
(74) *Attorney, Agent, or Firm* — Berkeley Law & Technology Group, LLP

(57) ABSTRACT

Briefly, embodiments of systems and/or methods for synthesis of zinc oxide are described, including a chamber enclosure, a wafer substrate holder, a fluid handling system, and sequences for implementation.

18 Claims, 14 Drawing Sheets

(56) References Cited

U.S. PATENT DOCUMENTS

| | | | |
|---|---|---|---|
| 5,770,126 A * | 6/1998 | Singh | B01J 13/02 |
| | | | 264/10 |
| 6,057,662 A | 5/2000 | McAndrew | |
| 6,078,064 A | 6/2000 | Ming-Jiunn et al. | |
| 6,409,907 B1 | 6/2002 | Braun et al. | |
| 6,776,173 B2 * | 8/2004 | Kamikawa | H01L 21/67051 |
| | | | 134/153 |
| 8,183,575 B2 | 5/2012 | Farmer et al. | |
| 8,414,971 B2 | 4/2013 | Oladeji | |
| 8,536,618 B2 | 9/2013 | Richardson et al. | |
| 8,637,334 B2 | 1/2014 | Thompson et al. | |
| 8,668,774 B2 | 3/2014 | Richardson | |
| 8,729,580 B2 | 5/2014 | Lester | |
| 8,790,614 B2 | 7/2014 | Richards | |
| 8,796,693 B2 | 8/2014 | Richardson et al. | |
| 8,926,750 B2 | 1/2015 | Richardson | |
| 10,407,315 B2 | 9/2019 | Richardson | |
| 10,727,374 B2 | 7/2020 | Richardson | |
| 2001/0051499 A1 | 12/2001 | Shinozak | |
| 2002/0092464 A1 * | 7/2002 | Nakagawa | C30B 19/00 |
| | | | 117/94 |
| 2002/0096196 A1 | 7/2002 | Toshima et al. | |
| 2002/0104476 A1 * | 8/2002 | Ferguson | C30B 25/14 |
| | | | 117/84 |
| 2003/0084838 A1 | 5/2003 | McCandlish | |
| 2005/0196887 A1 | 9/2005 | Liu | |
| 2006/0124051 A1 | 6/2006 | Yoshioka | |
| 2009/0017303 A1 | 1/2009 | Choy | |
| 2009/0134152 A1 * | 5/2009 | Sedlmayr | H05B 6/806 |
| | | | 219/687 |
| 2010/0263586 A1 | 10/2010 | Richardson | |
| 2011/0101414 A1 | 5/2011 | Thompson et al. | |
| 2011/0143048 A1 * | 6/2011 | Oladeji | H01L 21/02628 |
| | | | 427/529 |
| 2011/0204324 A1 | 8/2011 | Kim | |
| 2011/0259879 A1 | 10/2011 | Hanawa | |
| 2012/0048721 A1 | 3/2012 | Koji | |
| 2012/0255929 A1 | 10/2012 | Yamaguchi et al. | |
| 2012/0270013 A1 | 10/2012 | Kim | |
| 2013/0228808 A1 | 9/2013 | Lester | |
| 2014/0083352 A1 * | 3/2014 | Richardson | C30B 19/08 |
| | | | 117/64 |
| 2014/0087567 A1 * | 3/2014 | Toyoda | C23C 16/44 |
| | | | 438/782 |
| 2014/0105808 A1 | 4/2014 | McNeel | |
| 2014/0306236 A1 | 10/2014 | Richardson et al. | |
| 2016/0024688 A1 | 1/2016 | Richardson | |
| 2016/0130719 A1 | 5/2016 | Richardson | |
| 2017/0297921 A1 | 10/2017 | Richardson | |
| 2020/0039836 A1 | 2/2020 | Richardson | |

FOREIGN PATENT DOCUMENTS

| | | |
|---|---|---|
| CN | 102171836 A | 8/2011 |
| CN | 102362335 A | 2/2012 |
| CN | 102373435 A | 3/2012 |
| CN | 102774875 | 11/2012 |
| CN | 102950016 | 3/2013 |
| CN | 103633196 A | 3/2014 |
| CN | 103774224 | 5/2014 |
| CN | 103774224 A | 5/2014 |
| CN | 102485953 B | 7/2014 |
| CN | 103922390 | 7/2014 |
| CN | 103943366 | 7/2014 |
| CN | 109415809 A | 3/2019 |
| EP | 1901363 | 3/2008 |
| JP | 2008-169053 | 7/2008 |
| JP | 2008-169053 A | 7/2008 |
| JP | 2009046358 | 3/2009 |
| JP | 2011054866 A | 3/2011 |
| KR | 1020110131394 A | 12/2011 |
| WO | 201106347 A1 | 9/2011 |
| WO | 2014/147290 A1 | 9/2014 |
| WO | 2014147290 A1 | 9/2014 |
| WO | 2014196256 A1 | 12/2014 |

OTHER PUBLICATIONS

Andeen, et al, "Lateral Epitaxial Overgrowth of ZnO in Water at 90° C.," DOI: 10.1002/adfm.200500817, Advanced Functional Materials, 2006, 16, pp. 799-804.

Corial, "Coriai3001L:GaN & Sapphire Etching ICP System," http://www.corial.net/resources/13_3001L/Corial 3001L. pdf, Feb. 24, 2015, 19 Pages.

KhepriCoat marketing, Same Sun, More Power, Royal DSM, KhepriCoat, 2012, http://www.dsm.com/contentldam/dsm/cworld/en_US/documents/khepricoat-product-brochure.pdf, 8 Pages.

Kim, et al, "Growth of Heteroepitaxial ZnO Thin Films on GaN-Buffered Al2O3 (0001) Substrates by Low-Temperature Hydrothermal Synthesis at 90° C.," Advanced Functional Materials, 2007, 17, pp. 463-471.

Kim, et al, "Hydrothermal Growth of Periodic, Single-Crystal ZnO Microrods and Microtunnels," Advanced Materials, DOI: 10.1002/adma.200600257, 2009, pp. 2453-2457.

Kim, et al, "Light-Extraction Enhancement of GaInN Light-Emitting Diodes by Graded-Refractive-Index Indium Tin Oxide Anti-Reflection Contact," Advanced Materials, DOI: 10.1002/adma.200701015, 2008, 20, pp. 801-804.

Nijikovsky, et al, "Microstructure of ZnO films synthesized on MgAl2O4 from low-temperature aqueous solution: growth and post-annealing," J Mater Sci (2013) 48:1614-1622, DOI 10.1007/s10853-012-6918-9.

Pooley, et al, "Constrained, aqueous growth of three-dimensional single crystalline zinc oxide structures," APL Mater., vol. 2, No. 1, Jan. 2014, pp. 012111-1-012111-6.

Reading, et al, "High efficiency white LEDs with single-crystal ZnO current spreading layers deposited by aqueous solution epitaxy," Jan. 2, 2012, vol. 20, No. 81 Optics Express, pp. A13-A19.

Richardson, et al, "Controlling Low Temperature Aqueous Synthesis of ZnO. 2. A Novel Continuous Circulation Reactor," Crystal Growth & Design, vol. 9, No. 6, 2009, pp. 2576-2581.

Richardson, et al, "Controlling Low Temperature Aqueous Synthesis of ZnO. 1. Thermodynamic Analysis," Crystal Growth & Design, vol. 9, No. 6, pp. 2570-2575.

Richardson, et al, "Rapid synthesis of epitaxial ZnO films from aqueous solution using microwave heating," Journal of Materials Chemistry, www.rsc.org/materials, The Royal Society of Chemistry, 2010, 7 Pages.

Richardson, et al, "Semipolar Single-Crystal ZnO Films Deposited by Low-Temperature Aqueous Solution Phase Epitaxy on GaN Light-Emitting Diodes," Applied Physics Express 4, 2011 The Japan Society of Applied Physics, pp. xxxxxx-1-xxxxxx-3.

Richardson, et al, "Thermally Induced Pore Formation in Epitaxial ZnO Films Grown from Low Temperature Aqueous Solution," Crystal Growth & Design, 2011, 11 (8), pp. A-F.

Richardson, et al. "A Facile Route to Patterned Epitaxial ZnO Nanostructures by Soft Lithography", Journal of Materials Chemistry, 2011, 21, pp. 14417-14419, www.rsc.org/materials.

Scharrer, et al, "Fabrication of inverted opal ZnO photonic crystals by atomic layer deposition," App. Phys. Lett., vol. 86, No. 15,2005, pp. 151113-1-151113-3.

Stiegler, et al, "Correlative infrared-electron nanoscopy reveals the local structure-conductivity relationship in zinc oxide nanowires," Nature Communications, 3:1131, DOI: 10.1038/ncomms21181 www.nature.com/ naturecommunications, Oct. 16, 2012, pp. 1-7.

Thompson, et al, "Light Emitting Diodes with ZnO Current Spreading Layers Deposited from a Low Temperature Aqueous Solution," Applied Physics Express 2 (2009), 2009 The Japan Society of Applied Physics, pp. 042101-1-042101-3.

U.S. Appl. No. 14/846,655: Application as filed Sep. 4, 2015, 101 pages.

U.S. Appl. No. 14/846,655: Filing Receipt Sep. 21, 2015, 3 pages.

U.S. Appl. No. 14/846,655: Notice to File Corrected Application dated Sep. 21, 2015, 2 pages.

(56) References Cited

OTHER PUBLICATIONS

U.S. Appl. No. 14/846,655: Applicant Response to Pre-Exam Formalities Notice dated Nov. 23, 2015, 19 pages.
U.S. Appl. No. 14/846,655: Filing Receipt Nov. 25, 2015, 3 pages.
U.S. Appl. No. 14/846,655: Requirement for Restriction/Election, dated Apr. 5, 2016, 10 pages.
U.S. Appl. No. 15/099,575: Application as filed Apr. 14, 2016, 120 pages.
U.S. Appl. No. 15/099,580: Application as filed Apr. 14, 2016, 122 pages.
U.S. Appl. No. 14/341,700, Application as filed Jul. 25, 2014, 69 Pages.
U.S. Appl. No. 14/341,700, Filing Receipt, Aug. 6, 2014, 3 pages.
U.S. Appl. No. 14/341,700, Notice to File Corrected Application Papers, Aug. 6, 2014, 2 pages.
U.S. Appl. No. 14/341,700, Applicant Response to Pre-Exam Formalities Notice and Amendments, dated Oct. 6, 2014, 120 pages.
U.S. Appl. No. 14/341,700, Filing Receipt, Oct. 9, 2014, 3 pages.
U.S. Appl. No. 14/341,700, Filing Receipt, Oct. 17, 2014, 3 pages.
U.S. Appl. No. 14/341,700, Requirement for Restriction/Election, dated Jan. 27, 2016, 7 pages.
U.S. Appl. No. 14/341,700, Notice of Publication, dated Jan. 28, 2016, 1 page.
U.S. Appl. No. 14/341,700, Response to Election/Restriction and Amendment, dated Feb. 16, 2016, 6 pages.
U.S. Appl. No. 14/341,700, Non-Final Rejection, dated Mar. 7, 2016, 6 pages.
U.S. Appl. No. 14/846,655: Response to Election/Restriction filed, Sep. 2, 2016, 7 pages.
U.S. Appl. No. 14/846,655: Non-Final Rejection, dated Oct. 14, 2016, 17 pages.
U.S. Appl. No. 14/846,655: Amendment/Req. Reconsideration-After Non-Final Reject, dated Jan. 17, 2017, 21 pages.
U.S. Appl. No. 14/846,655: Final Rejection, dated Mar. 1, 2017, 21 pages.
U.S. Appl. No. 14/846,655: Notice of Publication, Mar. 9, 2017, 1 page.
U.S. Appl. No. 14/341,700, Final Rejection, dated Oct. 12, 2016, 10 pages.
U.S. Appl. No. 14/341,700, RCE and Amendments, dated Mar. 13, 2017, 22 pages.
Baddi, "Use LEDs as photodiodes," EDN Network, Nov. 18, 2010, https://www.edn.com/design/led/4363842/Use-LEDs-as-photodiodes,1 page.
Nicholas, et al., "The mechanism for hydrothermal growth of zinc oxide", CrystEngComm, www.rsc.org/crystengcomm, 2011, vol. 14, No. 4, Feb. 21, 2012, pp. 1232-1240.
Wang, et al., From Zn(OH)2 to ZnO: a study on the mechanism of phase transformation, CrystEngComm, www.rsc.org/crystengcomm, 2011, vol. 13, pp. 6024-6026.
U.S. Appl. No. 15/099,575: Notice of Publication, dated Oct. 19, 2017, 1 page.
U.S. Appl. No. 15/099,580: Non-Final Rejection, dated Oct. 4, 2017, 9 pages.
U.S. Appl. No. 15/099,580: Notice of Publication, dated Oct. 19, 2017, 1 page.
U.S. Appl. No. 14/341,700, Amendment/Req. Reconsideration-After Non-Final Reject, dated Jul. 17, 2017, 80 pages.
U.S. Appl. No. 14/341,700, Final Rejection, dated Oct. 18, 2017, 12 pages.
Notification of Transmittal of the International Search Report and the Written Opinion of the International Searching Authority, or the Declaration, App. No. PCT/IB2016/055272, dated Jun. 19, 2017, 14 pages.
Communication in Cases for Which No Other Form is Applicable, App. No. PCT/IB2016/055272, dated Oct. 3, 2016, 2 pages.
Notification of Transmittal of the International Search Report and the Written Opinion of the International Searching Authority, or the Declaration, App. No. PCT/US17/27335, dated Aug. 25, 2017, 22 Pages.
U.S. Appl. No. 14/846,655: Response to Election/Restriction and Amendments, dated Jun. 3, 2016, 7 pages.
U.S. Appl. No. 14/846,655: Notice to applicant regarding non-compliant or non-responsive amendment, dated Jul. 11, 2016, 4 pages.
U.S. Appl. No. 15/099,575: Applicant Response to Pre-exam Formalities Notice, dated Jun. 8, 2016, 25 pages.
U.S. Appl. No. 15/099,575: Filing Receipt, Jun. 17, 2016, 3 pages.
U.S. Appl. No. 15/099,580: Applicant Response to Pre-exam Formalities Notice, dated Jun. 8, 2016, 25 pages.
U.S. Appl. No. 15/099,580: Filing Receipt, Jun. 16, 2016, 3 pages.
U.S. Appl. No. 14/341,700, Amendment/Req. Reconsideration-After Non-Final Rejection, dated Jul. 7, 2016, 136 pages.
U.S. Appl. No. 14/846,655: Response After Final Action, dated Jul. 3, 2017, 24 pages.
U.S. Appl. No. 14/846,655: Advisory Action, dated Jul. 13, 2017, 3 pages.
U.S. Appl. No. 14/846,655: RCE and Amendments, dated Aug. 1, 2017, 26 pages.
U.S. Appl. No. 15/099,580: Requirement for Restriction/Election, dated May 4, 2017, 5 pages.
U.S. Appl. No. 15/099,580: Response to Election/Restriction filed, Jul. 5, 2017, 7 pages.
U.S. Appl. No. 14/341,700, Non-Final Rejection, dated Apr. 17, 2017, 10 pages.
PCT/US17/27335: International Search Report and Written Opinion, dated Aug. 25, 2017, 22 pages.
Gregory, O.J. et al., "Fabrication of High Conductivity, Transparent Electrodes with Trenched Metal Bus Lines", J. Electrochem. Soc., vol. 138, No. 7, Jul. 1991.
U.S. Appl. No. 15/099,575: Response to Restriction/Election and Amendments, dated Feb. 26, 2018, 7 pages.
U.S. Appl. No. 15/099,575: Non-Final Rejection, dated Mar. 27, 2018, 20 pages.
U.S. Appl. No. 15/099,580: Final Rejection, dated May 7, 2018, 16 pages.
U.S. Appl. No. 14/341,700, After Final Consideration Program Decision, Mar. 1, 2018, 1 page.
U.S. Appl. No. 14/341,700, Advisory Action, dated Mar. 1, 2018, 2 pages.
U.S. Appl. No. 14/341,700, RCE and Amendments, dated Mar. 19, 2018, 56 pages.
U.S. Appl. No. 14/846,655: Non-Final Rejection, dated Jan. 22, 2018, 23 pages.
U.S. Appl. No. 15/099,575: Requirement for Restriction/Election, dated Dec. 28, 2017, 8 pages.
U.S. Appl. No. 15/099,580: Amendment/Req. Reconsideration-After Non-Final Reject, dated Jan. 4, 2018, 13 pages.
U.S. Appl. No. 14/341,700, After Final Consideration Program Request, Feb. 15, 2018, 98 pages.
U.S. Appl. No. 14/846,655: Amendment/Req. Reconsideration-After Non-Final Rejection, dated May 11, 2018, 33 pages.
U.S. Appl. No. 14/846,655: Final Rejection, dated Jul. 6, 2018, 24 pages.
U.S. Appl. No. 15/099,575: Amendment/Req. Reconsideration-After Non-Final Rejection, dated Jun. 27, 2018, 21 pages.
U.S. Appl. No. 15/099,580: Response After Final Action, dated Jul. 10, 2018, 20 pages.
U.S. Appl. No. 14/341,700, Non-Final Rejection, dated Jun. 13, 2018, 8 pages.
PCT—International Preliminary Report on Patentability for PCT Application PCT/US17/27335 dated Oct. 25, 2018, 10 pages.
Entegris, "Measuring Liquid in a Vessel With Gaseous Head Pressure", 2004, 2 pages.
U.S. Appl. No. 14/846,655: RCE and Amendments, dated Nov. 6, 2018, 33 pages.
U.S. Appl. No. 14/846,655: Notice to the applicant regarding non-compliant or non-responsive amendment, dated Nov. 8, 2018, 3 pages.
U.S. Appl. No. 14/846,655: Response to notice of non-compliance, dated Nov. 29, 2018, 32 pages.
U.S. Appl. No. 15/099,575: Response After Final Action, dated Nov. 13, 2018, 33 pages.

(56) References Cited

OTHER PUBLICATIONS

U.S. Appl. No. 15/099,575: Advisory Action, dated Nov. 21, 2018, 3 pages.
U.S. Appl. No. 15/099,575: RCE and Amendments, dated Dec. 10, 2018, 34 pages.
U.S. Appl. No. 15/099,580: Non-Final Rejection, dated Oct. 2, 2018.
U.S. Appl. No. 14/341,700, Amendment/Req. Reconsideration-After Non-Final Reject, dated Oct. 12, 2018, 31 pages.
U.S. Appl. No. 14/846,655: Response After Final Action, dated Sep. 14, 2018, 25 pages.
U.S. Appl. No. 14/846,655: Advisory Action, dated Sep. 27, 2018, 4 pages.
U.S. Appl. No. 15/099,575: Final Rejection, dated Aug. 13, 2018, 18 pages.
U.S. Appl. No. 15/099,580: Advisory Action, dated Aug. 9, 2018, 3 pages.
U.S. Appl. No. 15/099,580: RCE and Amendments, dated Sep. 6, 2018, 20 pages.
Ahn et al, "Effects of a low-temperature sulfidation process . . . ZnO nanowires . . . " Cryst. Eng. Comm. 15 , pp. 6709-6714. (Year 2013).
Translation of CN 103774224 Year 2014).
Translation of Japan 2008-169053 (Year 2008).
U.S. Appl. No. 14/846,655: Non-Final Rejection, dated May 23, 2019, 27 pages.
U.S. Appl. No. 15/099,575: Final Rejection, dated May 10, 2019, 20 pages.
U.S. Appl. No. 15/099,580: Notice of Allowance and Fees Due, dated Apr. 18, 2019, 8 pages.
U.S. Appl. No. 14/341,700, Non-Final Rejection, dated May 21, 2019, 16 pages.
U.S. Appl. No. 15/099,575: Amendment/Req. Reconsideration-after Non-Final Rejection, dated Apr. 5, 2019, 12 pages.
U.S. Appl. No. 15/099,580: Amendment/Req. Reconsideration-After Non-Final Rejection, dated Dec. 26, 2018, 18 pages.
U.S. Appl. No. 14/341,700, Notice to the applicant regarding a non-compliant or non-responsive amendment, dated Feb. 4, 2019, 3 pages.
U.S. Appl. No. 14/341,700, Amendment/Req. Reconsideration-After Non-Final Reject, dated Feb. 15, 2019, 55 pages.
U.S. Appl. No. 15/099,575: Response after Final Rejection, dated Jul. 10, 2019, 19 pages.
U.S. Appl. No. 15/099,575: Advisory Action, dated Jul. 19, 2019, 5 pages.
U.S. Appl. No. 15/099,575: RCE and Amendments, dated Aug. 12, 2019, 19 pages.
U.S. Appl. No. 15/099,575: Non-Final Rejection, dated Sep. 24, 2019, 18 pages.
U.S. Appl. No. 15/099,580: Amendment After notice of Allowance, dated Jul. 18, 2019, 3 pages.
U.S. Appl. No. 15/099,580: Issue Fee Payment, Jul. 18, 2019, 1 page.
U.S. Appl. No. 15/099,580: Issue Notification, dated Aug. 21, 2019, 1 page.
U.S. Appl. No. 16/539,182: Application as filed Aug. 13, 2019, 133 pages.
U.S. Appl. No. 16/539,182: Filing Receipt and Notice to File Missing Parts, Aug. 23, 2019, 5 pages.
Franssila, Sam "Introduction to Microfabrication", published by John Wiley & Sons, Ltd., 2005, 422 pages, Doc 1025.
Guder et al, "Improved Optical Properties of ZnO Thin Films by Concurrently Introduced Interfacial Voids During Thermal Annealing", App. Phys. Let. 99, 2011 (Year: 2011), Doc 1048.
Ahn et al, "Effects of a Low-Temperature Sulfidation Process . . . ZnO Nanowires . . . " Cryst. Eng. Comm. 15, pp. 6709-6714 (Year: 2013), Doc 1052.
U.S. Appl. No. 14/846,655: Response to Non-final Office Action filed Oct. 23, 2019, 24 pages, Doc 1021.
U.S. Appl. No. 14/846,655: Final Office Action filed Oct. 23, 2019, 12 pages, Doc 1022.
U.S. Appl. No. 14/846,655: Examiner Interview Summary dated Feb. 10, 2020, 3 pages, Doc 1023.
U.S. Appl. No. 14/846,655: Response to Final Office Action filed Feb. 20, 2020, 438 pages, Doc 1024.
U.S. Appl. No. 14/846,655: Notice of Allowance and Allowability dated Feb. 26, 2020, 14 pages, Doc 1026.
U.S. Appl. No. 14/846,655: Notice to File Corrected Application Papers dated Apr. 23, 2020, 3 pages, Doc 1027.
U.S. Appl. No. 14/846,655: Response to Notice to File Corrected Application Papers filed May 15, 2020, 9 pages, Doc 1028.
U.S. Appl. No. 14/846,655: Issue Fee Payment and 312 Amendment filed May 26, 2020, 18 pages, Doc 1029.
U.S. Appl. No. 14/846,655: Corrected Notice of Allowability dated Jun. 16, 2020, 9 pages, Doc 1030.
U.S. Appl. No. 14/846,655: Issue Notification dated Jul. 8, 2020, 1 page, Doc 1031.
U.S. Appl. No. 16/936,205: U.S. Appl. No. 16/936,205, filed Jul. 22, 2020, 116 pages, Doc 1032.
U.S. Appl. No. 16/936,205: Notice to File Corrected Application Papers dated Jul. 31, 2020, 2 pages, Doc 1033.
U.S. Appl. No. 16/936,205: Filing Receipt dated Jul. 31, 2020, 4 pages, Doc 1034.
CN 201680053481.X: Office Action dated Jan. 19, 2020, 58 pages, Doc 1035.
KR 10-2018-7032790: Request for Examination filed Apr. 9, 2020, 12 pages, Doc 1007.
U.S. Appl. No. 15/099,575: Advisory Action dated Jul. 19, 2019, 4 pages, Doc 1040.
U.S. Appl. No. 15/099,575: Request for Continued Examination and Amendment filed Aug. 12, 2019, 30 pages, Doc 1041.
U.S. Appl. No. 15/099,575: Non-final Office Action dated Sep. 24, 2019, 24 pages, Doc 1042.
U.S. Appl. No. 15/099,575: Response to Non-final Office Action filed Dec. 19, 2019, 22 pages, Doc 1008.
U.S. Appl. No. 15/099,575: Response to Non-final Office Action filed Jan. 29, 2020, 30 pages, Doc 1009.
U.S. Appl. No. 15/099,575: Response to Non-final Office Action filed Mar. 30, 2020, 18 pages, Doc 1010.
U.S. Appl. No. 15/099,575: Advisory Action dated Apr. 6, 2020, 5 pages, Doc 1011.
U.S. Appl. No. 15/099,575: RCE and Amendment filed Apr. 29, 2020, 19 pages, Doc 1012.
U.S. Appl. No. 15/099,575: Non-final Office Action dated May 8, 2020,72 pages, Doc 1013.
U.S. Appl. No. 16/539,182: U.S. Appl. No. 16/539,182, filed Aug. 13, 2019, 138 pages, Doc 1043.
U.S. Appl. No. 16/539,182: Notice to File Corrected Application Papers dated Aug. 23, 2019, 2 pages, Doc 1014.
U.S. Appl. No. 16/539,182: Response to Notice to File Corrected Application Papers with Replacement Figures filed Oct. 23, 2019, 20 pages, Doc 1015.
U.S. Appl. No. 16/539,182: Notice of Publication dated Feb. 6, 2020, 1 page, Doc 1016.
U.S. Appl. No. 14/341,700: Response to Non-final Office Action filed Oct. 20, 2019, 18 pages, Doc 1044.
U.S. Appl. No. 14/341,700: Office Communication dated Jan. 10, 2020, 2 pages, Doc 1045.
U.S. Appl. No. 14/341,700: Response to Office Communication filed Jan. 16, 2020, 18 pages, Doc 1046.
U.S. Appl. No. 14/341,700: Final Office Action dated Apr. 29, 2020, 21 pages, Doc 1047.
U.S. Appl. No. 14/341,700: Response to Final Office Action filed Jun. 26, 2020, 22 pages, Doc 1049.
U.S. Appl. No. 14/341,700: Advisory Action dated Aug. 3, 2020, 4 pages, Doc 1050.
Response to Notice to File Corrected Application Papers, U.S. Appl. No. 16/936,205, filed Sep. 29, 2020, 12 pages.
Updated Filing Receipt, U.S. Appl. No. 16/936,205, dated Oct. 1, 2020, 3 pages.
Office Action, CN Patent Application No. 201680053481, dated Sep. 27, 2020, 7 pages.
Response to Office Action, CN Patent Application No. 201680053481, filed Dec. 8, 2020, 37 pages.

(56) References Cited

OTHER PUBLICATIONS

Office Action, CN Patent Application No. 201780031214, dated Jun. 19, 2020, 18 pages.
Response to Office Action, CN Patent Application No. 201780031214, filed Oct. 21, 2020, 27 pages.
Amendment, U.S. Appl. No. 15/099,575, filed Aug. 10, 2020, 25 pages.
Terminal Disclaimer, U.S. Appl. No. 15/099,575, filed Aug. 10, 2020, 7 pages.
Final Office Action, U.S. Appl. No. 15/099,575, dated Sep. 4, 2020, 31 pages.
Interview Summary, U.S. Appl. No. 15/099,575, dated Oct. 23, 2020, 5 pages.
Amendment and RCE, U.S. Appl. No. 15/099,575, filed Dec. 1, 2020, 24 pages.
Amendment and RCE, U.S. Appl. No. 14/341,700, filed Aug. 17, 2020, 34 pages.
Notice of Publication, U.S. Appl. No. 16/936,205, dated Jan. 7, 2021, 1 page.
Office Action, CN Patent Application No. 201780031214, dated Dec. 15, 2020, 15 pages.
Interview Summary, U.S. Appl. No. 15/099,575, dated Dec. 15, 2020, 4 pages.
Notice of Allowance, U.S. Appl. No. 15/099,575, dated Dec. 23, 2020, 13 pages.
Non-Final Office Action, U.S. Appl. No. 14/341,700, dated Dec. 23, 2020, 19 pages.

\* cited by examiner

CHAMBER ENCLOSURE AND/OR WAFER HOLDER FOR SYNTHESIS OF ZINC OXIDE

BACKGROUND

1. Field

This disclosure relates to synthesis of zinc oxide (ZnO), such as via a growth and/or deposition process.

2. Information

In a laboratory, ZnO may be synthesized, such as via a process involving a relatively low temperature aqueous solution. The capability to synthesize ZnO may be useful, such as for fabrication of a transparent conductive contact for GaN type light emitting diodes (LEDs), as one non-limiting example. However, more economical synthesis processes for use in industrial situations, such as for higher volume production, remain to be developed.

BRIEF DESCRIPTION OF DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1:
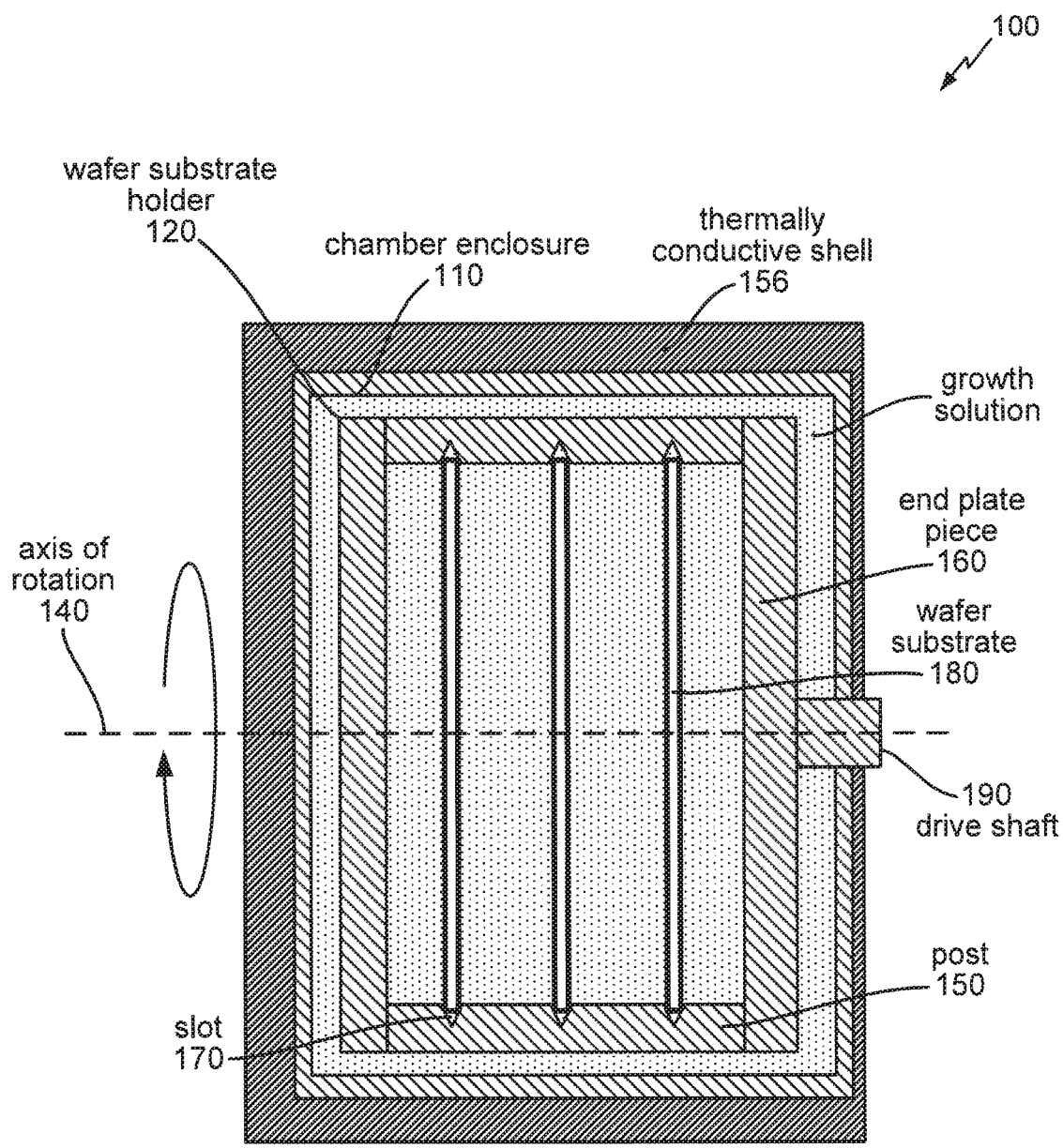
FIG. 1 is a side view illustration of an embodiment of a chamber enclosure and a wafer substrate holder.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like means that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has always been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers at least to the context of the present patent application.

Synthesis of zinc oxide via a relatively low temperature aqueous solution growth process has been developed in the laboratory. Furthermore, as mentioned, synthesis of zinc oxide may be useful in a variety of applications, including as a non-limiting example, applications that involve optoelectronics, such as fabrication of a transparent conductive contact for GaN type light emitting diodes (LEDs), to provide one example. However, adapting or transferring a synthesis process first developed in the laboratory into an industrial manufacturing process of commercial value is a challenging and complex undertaking.

A variety of considerations are involved. As an illustration, consider use of ZnO synthesis in an optoelectronic device. It would be desirable for a synthesis process to align conveniently with other aspects of optoelectronic device fabrication, including operations, such as wafer cleaning, photoresist processing, plasma and/or wet chemical etching, vacuum deposition, chemical vapor deposition, annealing, chemical and mechanical polishing, dicing, wire bonding, potting, encapsulation, etc., etc., that are likely to take place to produce an end product. Furthermore, to be of industrial utility, a synthesis process should be more economical than it may be in a laboratory setting where it may have been created. A laboratory setting comprises a relatively small setting in terms of manufacturing scale, with a small number of fabrication "runs," so that cost, in general, may be relatively high, at least in comparison with usual industrial device fabrication approaches; however, this is not unusual in order to develop a working synthesis process.

Still, after a working process is developed successfully, focus may shift to larger scale production, higher volumes, higher repetition rates, higher yields, a smaller number of possible variations, and to lower cost. That is, movement from laboratory development to industrial use drives such a shift in focus. Along these lines, it is desirable to craft an approach for use in an industrial environment that is sufficiently flexible and/or adaptable to be useful in several settings and/or for several potential industrial applications; however, at the same time, an approach should be sufficiently precise and sufficiently accurate so that processes are able to be repeated in a manner that produces substantially the same results or output if substantially the same processes are followed. That is, if a specific formulation is followed, substantially the same output should be produced. To accomplish this on a relatively large scale and at a relatively acceptable cost can be quite a challenge and may involve careful process planning and/or orchestration. Furthermore, limitations of a process may also be a factor. That is, understanding the limits of a process so that quality and/or consistency of properties is not compromised substantially is also desirable.

In an illustrative example, a zinc oxide aqueous growth solution may contain dissolved zinc, ammonia and/or another source of similarly acting complexing ligands, and an acid or base to achieve a desired pH. The term "growth solution" refers to a solution from which synthesis (e.g., precipitation or deposition) of a material may take place, such as, for example, if a solution is supersaturated and conditions for nucleation and/or for crystal growth, are thermodynamically favorable. It is noted that throughout this document the terms "growth" and "deposition" may be employed interchangeably without loss or change of meaning if used to refer to synthesis of zinc oxide via a relatively low temperature aqueous solution process. In this context, a zinc oxide, which is used interchangeably with the term ZnO, comprises a material primarily of zinc and oxygen atoms arranged at least partially in a crystalline phase (e.g., a crystal structure) for zinc oxide, such as, for example, the Wurtzite crystal structure. A zinc oxide crystal may contain atoms other than zinc and oxygen in a manner in which those atoms substitute for a zinc or oxygen atom in the crystal structure and/or reside in interstitial regions of the crystal structure. A zinc oxide crystal may likewise contain atomic vacancies, dislocations, and/or other crystal defects, as well as inclusions of second phases. Zinc may be supplied to a growth solution in a variety of ways, including by dissolving a zinc containing compound, in this context referred to as a zinc nutrient.

Besides ammonia, other sources of ammine ligands, as well as other ligands which may result in a similar ZnO solubility, for example, may be employed as well. In this context, ammine refers to a ligand in a metal complex containing at least one ammine ($-NH_3$) ligand. Aqueous solutions of ammonia dissolved in water are commonly referred to as an ammonium hydroxide solution, ammonia water, aqua ammonia, household ammonia, and/or simply ammonia. Ammine ligands may also be supplied to an aqueous solution by dissolving ammonium salts. Examples include, but are not limited to, simple inorganic and/or organic salts, such as ammonium chloride, ammonium nitrate, ammonium acetate, ammonium carbonate, triammonium citrate, etc. Ammine ligands may also be supplied as part of a soluble coordination compound or double salt. Additionally, ammine ligands may be supplied by in situ decomposition of another compound, such as urea and/or hexamine, for example. Other ligands which may form aqueous complexes of Zn (II) may result in a temperature range of decreasing solubility of ZnO with increasing temperature and may, therefore, also be used. (It is noted that likewise pressure may also affect solubility properties, although for the immediately prior statement, atmospheric pressure was implicitly assumed). Other ligands with potential to behave in this manner include, but are not limited to, water soluble primary amines, secondary amines, tertiary amines, and/or polyamines. Non-nitrogen containing ligands which form complexes and result in desired solubility behavior for ZnO, as previously described, may potentially also be used.

Synthesis of one phase of material from another, such as zinc oxide crystallization using an aqueous growth solution, may involve nucleation. Different types of nucleation may be employed in a process for synthesizing one or more crystals of ZnO. For example, in one illustrative embodiment, a process may be employed in which an epitaxial ZnO film is grown from a relatively low temperature aqueous solution. For example, a zinc oxide film may be grown from an aqueous solution using a two-part process, such that a first part accomplishes nucleation, for example, heteroepitaxial nucleation, of a ZnO crystal on another material, for example, GaN. Alternatively, nucleation and subsequent growth of a ZnO film may also be achieved in a 1-part aqueous solution process. Alternatively, synthesis of ZnO may comprise growth, e.g., deposition, on an existing ZnO crystal or crystals, which may or may not have been synthesized from aqueous solution. Thus, synthesis of zinc oxide via a relatively low temperature aqueous solution process may vary in numerous ways and that has potential to affect a resulting material.

A rate of ZnO synthesis, and/or properties of ZnO synthesized, may potentially be affected by a variety of factors, such as solution composition, circulation rate, volume, temperature, pressure, rate of temperature change, rate of pressure change, time at a given process condition, etc. These factors may influence both intrinsic and extrinsic properties of ZnO synthesized. Examples of intrinsic properties that might be impacted could include: defect concentration, crystalline grain structure, porosity and/or density of ZnO synthesized. Examples of extrinsic properties that might be affected could include: layer thickness, layer thickness uniformity, and/or layer roughness of ZnO synthesized. In general, therefore, at a high level, a process may comprise creating conditions to produce ZnO synthesis from a supersaturated aqueous growth solution of dissolved zinc complexes at an appropriate temperature and pH (and/or pressure, if appropriate). Synthesis of ZnO may, in one example embodiment, comprise epitaxial growth of ZnO from a dissolved zinc complex in solution. Thus, initially, it may be desirable to have a relatively high supersaturation rate, such as in an embodiment seeking to produce homogeneous or heterogeneous nucleation, for example. However, depending on a variety of factors, for example, it may also be desirable for a supersaturation rate to later be lowered for higher quality crystal growth following initial nucleation, or initially lower, if for example, growth is being performed on a pre-existing ZnO crystal. In general, as suggested, a variety of approaches is possible and may be employed. Therefore, a system to implement synthesis of ZnO via a relatively low temperature aqueous process, but having a particular or limited set of process parameters capable of being adjusted, as appropriate for a given situation, may be desirable, such as for industrial use, for reasons alluded to previously, for example.

Different processes may be employed to grow different physical forms and/or geometries. As a non-limiting illustration, one or more zinc oxide crystals may, for example, form single crystals, such as at least part in at least one of the following forms: an epitaxial film; a single crystal film; a single crystal particle; a bulk single crystal, or an array or a pattern of micro- or smaller dimensioned single crystal structures. Although claimed subject matter is not limited in scope in this respect, a particle may typically be less than 100 microns, whereas a bulk crystal may typically be greater than 100 microns. Likewise, one or more zinc oxide crystals may also form a polycrystalline body, such as, part of at least one of the following forms: a polycrystalline film; a polycrystalline particle; a bulk polycrystalline body, or an array or pattern of micro- or smaller dimensioned polycrystalline structures.

It is well established that zinc oxide may be produced by multiple types of solution crystal growth and/or deposition techniques, including example process embodiments as alluded to previously, for example. Likewise, relatively low temperature solution type methods for synthesizing zinc oxide in the form of nanostructures, particles and powders, polycrystalline films, epitaxial films, and/or bulk single crystals are known. Thus, as suggested previously and described in more detail below, processes may be specifically formulated to include various process parameter adjustments and/or modifications to synthesize zinc oxide crystals to produce a desired result, at least in terms of growth of zinc oxide with certain desired properties, but in a manner that is scalable, cost-effective and/or provides sufficient repeatability for use in industry.

Thus, as one illustrative embodiment, a process may comprise growing one or more zinc oxide crystals at least partially in an aqueous solution, such as for a particular application of synthesized zinc oxide crystals. One or more zinc oxide crystals may, for example, be grown in a manner so that one or more resulting zinc oxide crystals may potentially have physical properties with a possibility of making resulting crystals more effective for a particular application. For example, ZnO crystals may be grown in a manner that the ZnO crystals have improved properties for a particular application due at least in part to intra-crystalline porosity, at least relative to fully dense zinc oxide crystals, as previously discussed. See, e.g., U.S. patent application Ser. No. 14/341,700, filed Jul. 25, 2014, titled "Fabrication and/or Application of Zinc Oxide Crystals with Internal (Intra-Crystalline) Porosity," by Richardson et al., herein incorporated by reference in its entirety. Thus, one or more zinc oxide crystals may be grown in a manner so as to at least partially modulate synthesis techniques in a selected number of ways, for example, to at least partially affect formation of the one or more zinc oxide crystals and, thus, likewise, potentially affect physical properties of the material.

However, providing a tension with the ability to partially modify synthesis techniques, a goal in synthesis may be to keep from inadvertently altering a chosen chemical composition of an aqueous solution from which one or more ZnO crystals are to be synthesized. For example, changes to a chemical composition, such as those at least partially affecting pH, concentration and/or availability of zinc complexing ligands, may at least partially change a solubility differential for a given temperature change (and/or pressure change) and, thus, may consequently alter rate of ZnO crystal growth with a potential to alter resulting crystal structure from a particular structure being sought.

In an embodiment, rate of ZnO crystal growth may be at least partially affected by supply of reactants in an aqueous growth solution from which one or more ZnO crystals are to be synthesized. For example, an aqueous growth solution from which a ZnO crystal is to be synthesized may be periodically exchanged and/or may be continually flowing so as to provide a fresh supply of reactant species to replace those consumed by synthesis. Thus, rate of exchange and/or flow may be expected to alter rate of ZnO crystal growth, for example.

Likewise, in still another approach, temperature of (and/or pressure with respect to) one or more ZnO crystals during synthesis and/or temperature (and/or pressure with respect to) an aqueous solution from which one or more ZnO crystals are to be synthesized may at least partially affect rate of crystal growth. Similar to preceding approaches, higher temperatures, as an example, during synthesis at least in theory allow more atoms being added to a surface of a growing crystal to find lower energy configurations. Higher temperatures provide additional energy for atomic mobility and for overcoming activation energy barriers, for example, again at least in theory. For synthesis of one or more ZnO crystals from aqueous solution, as well, theoretically lower temperatures may be expected to produce higher residual hydrogen and atomic vacancies in a ZnO crystal from increasing an amount of incomplete conversion of soluble Zn ions containing hydroxyl ligands.

Thus, as discussed, an embodiment of a system for synthesizing zinc oxide may comprise a crystal growth solution employed in an environment in which synthesis parameters are capable of adjustment, such as, for example, adjusting temperature and/or pressure during crystal growth. Likewise, in an embodiment, modifying supply, flow, and/or circulation, such as of a crystal growth solution, may be employed. Likewise, any combination of the foregoing may be employed in an embodiment, of course, so that properties of synthesized material, such as zinc oxide, may be affected. However, as noted, for reasons related to scalability, cost, and/or repeatability, having a system with some limits on possible modifications, such as to processes, process sequences, sequences of operations and operations, including limits as to amount of possible adjustments, as to type of possible adjustments, and/or as to size of possible adjustments, may also provide benefits.

Thus, in an embodiment, a system apparatus for solution synthesis of materials, such as zinc oxide, from a surrounding growth solution onto a wafer, wafer substrate, other substrate, and/or other surface, may be employed. However, variations in parameters to drive an underlying chemical reaction in connection with crystal synthesis in solution may comprise a select set, such as heating, raising pressure, and/or adjusting fluid flow. It is noted that the term "wafer substrate" is used as a generic and interchangeable term with "substrate", "wafer", and/or "other surface." In other words, these terms are used interchangeably without loss of generality or understanding and, in general, refer to a surface of a material capable of supporting growth of a synthesized substance from an aqueous solution, such as zinc oxide.

In one embodiment, a wafer substrate holder and a chamber enclosure may be used in which the wafer substrate holder is received within the chamber enclosure so that the wafer substrate holder while holding one or more wafer substrates is capable of being (e.g., is to be) rotated about an axis at least approximately normal to flat surfaces formed by the one or more wafer substrates held therein and passing at least approximately through centers of the one or more wafer substrates held therein. This may include, for example, two or more co-planar wafer substrates with an axis of rotation passing approximately through the center of the array of wafer substrates. It is noted that wafer substrates being held are stationary relative to the wafer substrate holder, even while it may be rotating. It is further noted that the following terms are used interchangeable throughout this document without loss or change in meaning: chamber, chamber enclosure, growth chamber, deposition chamber, synthesis chamber and/or the like.

Thus, in an example embodiment, multiple (e.g., at least two for this non-limiting example) wafer substrates may be placed in a wafer substrate holder that positions them at a set spacing with flat surfaces thereof at least approximately mutually parallel and at least approximately axially aligned via their centers. In an embodiment, a chamber enclosure may be cylindrical-like in shape, with its ends also being at least approximately mutually parallel to flat surfaces of to be loaded wafer substrates and at least approximately axially aligned. During a growth process formulation (GPF) operation, for example, in one embodiment, a liquid growth solution may fill a chamber enclosure, such as described, and synthesis may take place so that zinc oxide crystals may be formed, or existing zinc oxide crystals may grow, on wafer substrates, also enclosed therein, for example, as a result of heating and/or increasing pressure with respect to chamber enclosure contents (e.g., growth solution, wafer substrates, etc.). Although zinc oxide crystals may grow on either or both flat surfaces of a wafer substrate in some embodiments, for a particular embodiment, as explained in more detail later, synthesis of zinc oxide may take place on a first surface rather than on a second surface of a wafer substrate.

Figure 2:
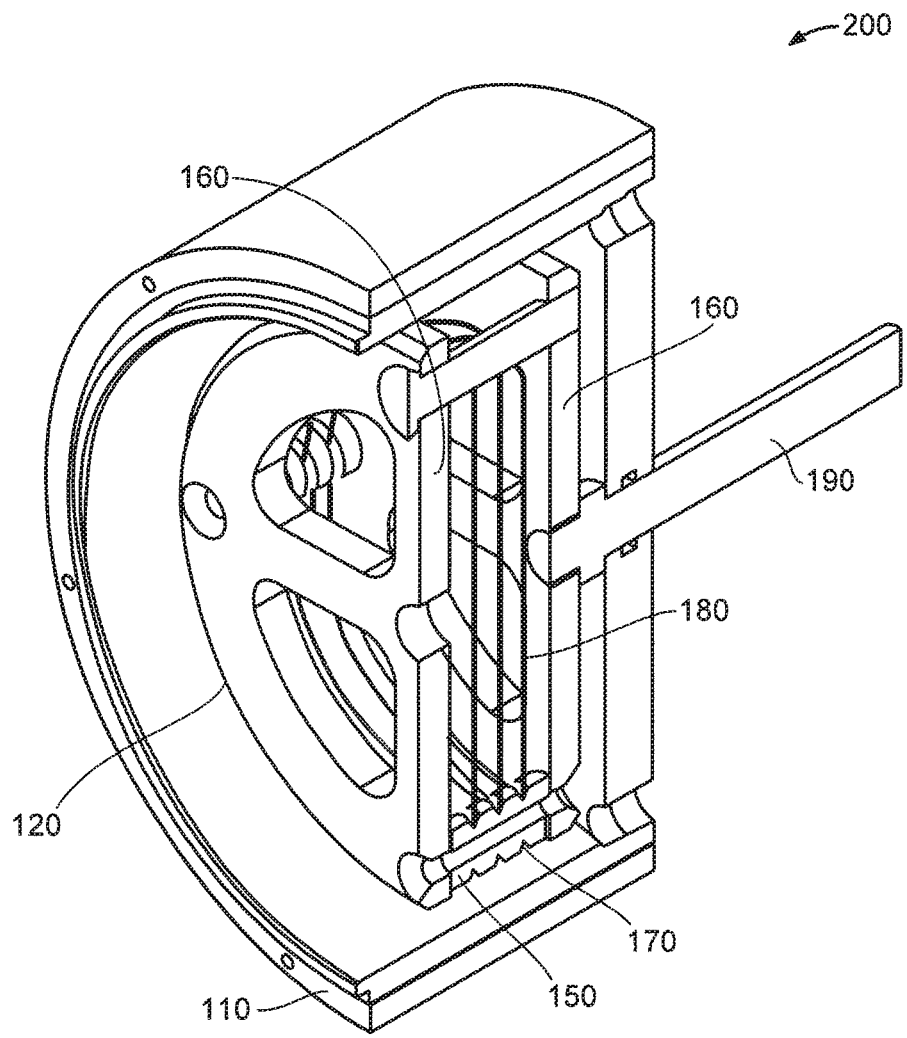
FIG. 2 is an isometric view illustration of the embodiment of FIG. 1.

In an embodiment, rotating action, such as of a wafer substrate holder, such as shown, for example, in FIGS. 1 and 2, may provide for relatively uniform growth characteristics within a chamber enclosure with respect to wafer substrates to be held as rotation takes place. Rotation may result in mixing of growth solution in a manner to provide a relatively more consistently homogeneous solution temperature and/or chemical composition. Gradients in solution temperature and/or chemical composition may be averaged by rotation, particularly relative to a wafer substrate surface, by continual movement through solution. In an embodiment, a wafer substrate holder is relatively open to allow adequate growth solution to flow around and between wafer substrates. For example, in an embodiment, it is desirable to not unnecessarily blocking solution flow.

Portions of a wafer substrate holder further from an axis of rotation are relatively nearer a cylindrical wall of a chamber enclosure in an embodiment. Thus, more movement nearer a chamber enclosure wall likely results in increased mixing of solution nearer to the wall. This may increase convective heat transfer from a chamber enclosure wall to enclosed solution and potentially improve solution temperature uniformity as a result. Likewise, in an embodiment in which a source of heat is in relative proximity to the wall, this may also reduce risk of overheating of solution immediately adjacent the wall, reducing risk of undesirable synthesis and/or growth of material on a chamber enclosure wall.

In an embodiment having axisymmetric features, such as shown in FIGS. 1 and 2, for example, wafer substrate capacity and/or chamber enclosure length may be expanded with associated proportional increases in chamber enclosure volume, cylindrical chamber wall area, and wafer substrate surface area (for consistent wafer substrate spacing). As a result, for a given embodiment of a chamber enclosure, any wafer substrate has a growth environment corresponding to any other similar wafer substrate (ignoring differences in growth environment for terminal wafer substrates compared to non-terminal wafer substrates). Thus, as chamber enclosure size and/or wafer capacity may increase, benefits for wafer production may scale similarly. That is, a substantial, if any, degradation in quality or change in properties, intrinsic and/or extrinsic, of material being grown should not result, for example, from linearly scaling length and wafer capacity within a chamber enclosure. Thus, relatively high growth synthesis uniformity is provided along with intrinsic scalability in an embodiment. Larger wafer substrate capacities per batch in such an embodiment should allow for increased production rates, which may assists in providing a process that has improved industrial utility.

A fluid handling system (FHS) is also provided in an embodiment to at least in part support programmable control and/or monitoring of synthesis and/or other associated processes to be performed. In an embodiment, a system is capable of being programmed in advance to fill and drain a chamber enclosure with growth solution before and after having completed one cycle of a planned (e.g., programmed) growth process (e.g., a growth process formulation (GPF)), and of managing with relatively high precision flow of growth solution, even as a wafer substrate holder rotates during execution of a cycle, for example. An embodiment may also be capable of being programmed to manage filling and draining of a chamber enclosure and some portions of a fluid handling system with rinsing and/or cleaning fluids, respectively, for example (rather than growth solution).

An embodiment of a FHS, such as for a relatively low temperature aqueous solution zinc oxide growth system (ZGS), may employ a "closed" interconnected network, that includes fluid valves, fluid lines, one or more process parameter sensors, one or more pressure vessels, one or more fluid pumps, one or more fluid sources and/or one or more fluid drains (e.g., collection points). For example, valves, such as fluid valves, are capable of being opened and closed, respectively, to direct fluid flow along a path to and direct fluid flow along a path from a chamber enclosure, usually at least in part via a control system, to perform processes, sequences of process operations, and/or process operations, such as for a cycle of a growth process formulation (GPF), for example. In this context, a control system refers to a system embodiment that is able to affect execution and/or performance of a process, including operations and/or sequences of operations, thereof, in whole or at least in part. Likewise, the term "control" refers to the ability to affect progress of a particular process embodiment, in whole or at least in part, including operations and/or sequences of operations thereof.

For example, valves may operate under electronic control, which may, for example, be provided at least in part by a control system. As another example, valves may be pneumatically controlled where a pneumatic signal may in turn be provided at least in part by devices under electronic control, again, such as provided by a control system, for example. Sensors placed at a path location along which fluid may flow likewise may monitor process embodiments, including operations and/or sequences of operations thereof, such as for confirmation regarding execution of one or more expected operations and/or for real-time adjustment, if appropriate. Also included are mechanisms to drive rotation as well as for heating and/or pressuring growth solution contained in a chamber enclosure, for example.

In an embodiment, surfaces of a fluid handling system (FHS) that may come in contact with growth solution, rinse fluid and/or cleaning fluid, for example, are to be formed from high purity, corrosion and/or contamination resistant materials. Examples include fluoropolymers, other engineered polymers and/or other engineered elastomers. In an embodiment, as suggested, an interconnected network of components in combination may form a "closed" fluid handling system capable of being integrated with a control system. The term "closed" refers to the absence of additional substances being introduced into, or substances being removed from, an embodiment of a FHS other than via programmed control and/or intentional human intervention. This may be contrasted with other fluid handling systems, such as an open bath, for example, in which substances may be processed; however, contact with and/or introduction and/or loss of substances, such as water or ammonia vapors, as examples, in a manner not explicitly intended in the process, may nonetheless take place. Potential benefits associated with this latter distinction in approach have previously been discussed.

For example, as was suggested, in a particular zinc oxide growth process formulation (GPF), a particular growth solution having a particular chemical makeup may be employed. Thus, during synthesis, it may be desirable to not inadvertently alter a chosen chemical composition of an aqueous solution, to be employed to synthesize one or more ZnO crystals, for example. Rather, changes to chemical composition, such as those at least partially affecting pH, concentration and/or availability of zinc complexing ligands, may at least partially change a solubility differential for a given temperature change and/or a given pressure change), for example, and, thus, may consequently alter rate of ZnO crystal growth with a potential to alter resulting crystal structure and/or properties from a particular structure and/or properties being sought. One way in an embodiment to accomplish such a result may be through use of an embodiment of a FHS that is closed (e.g., so as not to inadvertently affect chemical composition of a growth solution), which may include having system surfaces formed from high purity, corrosion and/or contamination resistant materials at least for surfaces that may contact growth solution, rinse fluid, and/or cleaning fluid, for example. Likewise, as shall become more clear later, particular sequencing of separate process embodiments and/or particular sequencing of operations within a particular process embodiment comprises another mechanism for accomplishing such a result.

In one embodiment, components of a FHS may generate, transmit, and/or receive electronic and/or pneumatic signals to and/or from other components thereof. Likewise, in an embodiment, components of a FHS may operate under common control of a control system, which may, for example, comprise a processor-type controller, such as a microprocessor, as one example. In an embodiment, a control system may drive an embodiment of a FHS via a central processing unit (CPU) and/or a processor, in which process sequences are to be monitored and/or controlled, as appropriate. Likewise, in an embodiment, multiple operations may be monitored and/or controlled concurrently.

As shall be seen, aspects of a complex GPF may be especially sensitive to particular process parameters (and/or to order of execution, e.g., sequencing of operations executed substantially in accordance with specified process-related parameters, for example). Thus, programmable monitoring and/or control of an embodiment of a process to be implemented and/or executed, for example, may reduce frequency and/or degree of operator generated errors and/or overall process variations, leading to a more consistent and/or higher yielding process embodiment, which as a result, may provide greater industrial utility. As noted, a control system may comprise, for example, at least one processor and at least one memory communicatively coupled via a communication bus in which instructions, such as computer instructions, to be executed are to be fetched from the at least one memory and then executed by the at least one processor. Likewise, a system interface (SI), which may include, for example, a graphical user interface (GUI), may be employed for an operator to set and/or adjust particular process-related parameters, such as for a GPF, in an embodiment. Thus, for example, a growth process formulation (GPF), as one example, may be created and stored in memory of a control system. In an embodiment, specific processes, including specific sequences of process operations, which may include particular operations to be performed substantially in accordance with user selected parameters, for example, under direction of a control system, in conjunction with an embodiment of a closed fluid handling system configuration, may offer advantages in reducing contamination, maintaining consistency, and/or maintaining safety (or even improving safety).

In one example of an embodiment, an apparatus may comprise a wafer substrate holder; and a fluid sealable chamber enclosure. A cavity within a chamber enclosure embodiment may be sized to receive and to enclose a wafer substrate holder. A chamber enclosure embodiment may, for example, have a cylindrical-like shape and may be used to heat zinc oxide growth solution to also be enclosed. In an embodiment, a wafer substrate holder may relatively securely position one or more wafer substrates so that flat surfaces thereof are substantially mutually parallel and are substantially mutually parallel to flat ends (e.g., end plate pieces). Further, in a wafer holder embodiment, posts may extend between end plate pieces of a wafer holder embodiment along an edge of the end plate pieces. Furthermore, wafer substrates to be processed may be relative securely held in place in a wafer substrate holder embodiment via particular types of geometric features, such as slits, slots, grooves, notches, or the like, in posts thereof to mate with wafer substrate edges. To securely hold a wafer substrate in place, there may be three or more points of contact between a perimeter thereof and a wafer substrate holder. In certain other embodiments, for example, where growth is desired on one flat surface of a wafer substrate, it may be secured so that a surface to not have growth thereon is physically held in direct contact with a flat plate of a wafer substrate holder. As shall be described, in an embodiment, a wafer substrate holder is further able to engage with a drive mechanism to rotate within a chamber enclosure embodiment, although claimed subject matter is not necessarily limited in scope in this respect.

Nonetheless, continuing, a wafer substrate holder embodiment may comprise a structure to be positioned in a manner so that during rotation thereof within a cavity of a chamber enclosure embodiment, growth solution is able to flow so as to contact flat surfaces of wafer substrates to be held and to flow around and between wafer substrates in a manner consistent with a relatively low temperature aqueous solution growth process formulation (GPF) of selected process-related parameters, for example. In an embodiment, a wafer substrate holder may rotate within a chamber enclosure about an axis of rotation located approximately perpendicular to flat surfaces of wafer substrates to be held and approximately passing through centers of wafer substrates to be held. Furthermore, in an embodiment, a wafer substrate holder may rotate in a manner and at a speed to result in a relatively uniform temperature and/or chemical composition for growth solution within a chamber enclosure during growth synthesis and so as to continually mix growth solution via action resulting from rotating movement.

In an example embodiment, a chamber enclosure may include at least one inlet port and at least one outlet port to respectively connect with a fluid handling system (FHS) embodiment. Thus, in an embodiment, growth solution may be received via inlet port(s) and growth solution may be drained from a chamber enclosure via outlet port(s). Furthermore, materials resistant to corrosion and/or resistant to contamination from being exposed to a growth solution may be used to form a chamber enclosure and a wafer substrate holder in an embodiment. Growth solution within a chamber enclosure, in an embodiment, may be heated via heat transfer from a thermally conductive shell, such as, for example, shell 156 formed of aluminum, via an inner chamber enclosure wall formed of a high purity, corrosion and/or contamination resistant material, such as, for example, a fluoropolymer. Likewise, an electrical heater element may transfer heat to the thermally conductive shell, in an embodiment. Of course, other approaches to generating heat for growth solution and to thereby drive a reaction may likewise be employed. As one example, rather than a heated thermally conductive shell, in an alternate embodiment, absorption of a form of radiation from a radiation source, such as radio frequency electromagnetic radiation, microwave frequency electromagnetic radiation, infrared electromagnetic radiation, and/or ultrasonic radiation, for example, may be employed to heat growth solution within a chamber enclosure.

In an example embodiment, a wafer substrate holder may be received within a chamber enclosure cavity via an end of a chamber enclosure that may be capable of being opened and of being closed and may be capable of being sealed relatively securely to hold a fluid in a chamber enclosure embodiment. In an example embodiment, a wafer substrate holder may engage with a drive mechanism (e.g., a drive motor), such as via a drive arm or via a rotor. Features of an arm or rotor, for example, may be constructed to mate with features of a wafer substrate holder embodiment. Similarly, a wafer substrate holder may be disengaged from a drive arm or rotor to be removed from a chamber enclosure. This allows wafer substrates to be loaded and unloaded while a wafer substrate holder is disengaged from a drive arm or rotor and removed from a chamber enclosure, thus providing easier access to wafer substrate positions in the holder. Likewise, as alluded, in an embodiment, a drive arm may connect to a mechanical drive motor so as to be rotated during motor operation. A schematic cross-section of an embodiment 100 of a chamber enclosure 110 with a wafer holder 120 within a chamber enclosure cavity is shown in FIG. 1. FIG. 2 shows an isometric cross-section of the embodiment of FIG. 1.

Now, referring to FIGS. 1 and 2, embodiment 100 illustrated includes a wafer substrate holder 120 and a chamber enclosure 110, as previously discussed. Chamber enclosure 110, as shown, comprises a cylindrical-like vessel with a substantially cylindrical cavity. An embodiment, such as 100, may include one or more mechanisms to allow a wafer substrate holder embodiment, such as 120, to be placed within and removed from a chamber enclosure cavity of chamber enclosure 110. For example, chamber enclosure 110 may be opened and closed via a "door" (e.g., closure) covering one circular end of chamber enclosure 110. In an example embodiment, a closed door of a chamber enclosure, such as 110, may be able to form a fluid tight seal with other walls of chamber enclosure 110 in an embodiment. Likewise, in an example embodiment, if opened, it may allow wafer substrate holder 120 to be accessed and/or inserted and removed.

Wafer substrate holder 120 in an embodiment may be capable of holding multiple wafer substrates 180, as shown. For an example embodiment, wafer substrates may be positioned with flat surfaces thereof substantially mutually parallel and substantially normal to axis 140, which may comprise an axis of rotation for an embodiment, as shown.

(Although FIG. 1 shows direction of rotation as clockwise, it is noted that rotation may instead be counter clockwise) Wafer substrate holder 120 may comprise at least two end plate pieces 160 oriented to have relatively flat surfaces thereof mutually substantially parallel to those of substrate wafers to be held therein. End plate pieces 160 in an example embodiment may be connected via multiple posts 150 extending between end plate pieces 160 along the edges thereof. Wafer substrate holder 120 may contact a loaded wafer substrate at multiple points along a wafer substrate edge. A wafer substrate may be stationary relative to a wafer holder embodiment even as rotation about axis 140 by wafer holder 120 takes place. Posts 150 include slits, slots, grooves or notches 170 to mate with an edge of a wafer substrate, in an embodiment. Posts may be positioned at angular locations of 120 degrees or 90 degrees, as examples, along a circumference of an edge of a wafer substrate to hold it in position within wafer substrate holder 120, in an embodiment. Thus, in an example embodiment, end plate pieces 160 and posts 150 may comprise several pieces of material joined or fastened together to form wafer substrate holder 120 so that a wafer substrate holder may separate into multiple pieces. However, in alternative example embodiments, a wafer holder substrate holder may be formed of a single piece of material. Thus, in an example embodiment, a wafer substrate holder may also comprise a feature or mechanism for alternately retaining and releasing wafer substrates from the holder, for growth and loading/unloading operations, respectively. As an example, referring to FIG. 2, a pin 155 is shown as a part of wafer substrate holder 120. In an embodiment, as illustrated by FIG. 2 in this example, pin 155 is designed to slide out of holes in end piece plates 160 to allow wafer substrates to be inserted and removed from holder 120. However, if inserted, pin 155 retains wafer substrates in holder 120, as shown. Thus, for example, pin 155 does not have notches, such as 170 (referring to FIG. 1), to allow it to be removable. Likewise, in a similar manner, a wafer substrate holder may also comprise at least two separable portions that combine in an interlocking manner so as to retain wafer substrate(s), but are separable to release wafer substrates in order to load and/or remove them.

In an embodiment, chamber enclosure 110 and wafer substrate holder 120 may comprise a mechanism to rotate a wafer substrate holder within a chamber enclosure. Thus, in an embodiment, such as this example, a chamber enclosure may be rigidly connected to an apparatus frame or housing. Axis of rotation 140 may be substantial normal to flat surfaces of wafers substrates in position within wafer substrate holder 120, as discussed. Rotational motion may be mechanically transferred from an external drive, such as, for example, an electric motor (not shown) to wafer substrate holder 120 via a drive shaft 190. Thus, rotary motion may be transferred to wafer substrate holder 120 while chamber enclosure 110 retains a fluid tight seal using a rotary seal between drive shaft 190 and chamber enclosure 110, for example.

Drive shaft 190 may connect with wafer substrate holder 120 so that rotary motion of drive shaft 190 is able to be transferred. A tangible, physical connection may permit wafer substrate holder 120 to be relatively easily disconnected from drive shaft 190 and removed from chamber enclosure 110, such as, for example, to unload and/or reload wafer substrates, and may then be reconnected to drive shaft 190 for execution of another growth process formulation (GPF) at a later time with respect to another set of substrate wafers. For example, wafer substrate holder 120 may connect to drive shaft 190 via a threaded arrangement. Drive shaft 190 may terminate with male threads, for example, and wafer substrate holder 120 may contain corresponding female threads such that, in an embodiment, holder 120 tightens on drive shaft 190 by threading in a direction opposite rotation direction, for example.

In an alternate embodiment, rotary motion may also be transferred from an external drive to wafer substrate holder 120 using a magnetic drive. Magnets fixed to a wafer substrate holder embodiment could, in effect, couple to rotating magnets outside of a chamber wall of chamber enclosure 110, for example. Furthermore, in an alternate embodiment, whether using a motor drive, a magnetic drive or another type of drive, a wafer holder may be held stationary as a chamber enclosure rotates. For example, a chamber enclosure may include internal features to produce growth solution turbulence during rotation. Likewise, in another embodiment, a chamber enclosure and a wafer holder might remain stationary as a drive mechanism produces mixing of growth solution, such as via a rotor, an agitator or similar component. Thus, in an embodiment, a drive mechanism may be employed to engage with a chamber enclosure, a wafer substrate holder, and/or another component that may comprise an extension of a chamber enclosure or a wafer substrate holder, for example, in order to produce mixing of growth solution while growth solution may be contained within an enclosed cavity, such as a cavity of a chamber enclosure.

As alluded, in an embodiment, crystals, for example, may be grown on either or both sides of a wafer substrate. Thus, for example, in an embodiment, as suggested, growth may take place on a first surface if it presents a lower energy site for growth than a second surface. As an example, in an embodiment, for wafer substrates to be used to fabricate light emitting diodes (LEDs), for example, GaN on a first wafer substrate surface may provide a lower energy surface for ZnO growth than sapphire on a second wafer substrate surface. Alternatively, a seed layer may be used on a surface of a wafer substrate. A seed layer may provide a lower energy surface for ZnO to grow on, for example, since a seed layer is also ZnO. Likewise, a seed layer could also be used on both surfaces of a wafer substrate or a seed layer in an embodiment may be patterned in selected areas on one or both surfaces to facilitate growth.

It is noted that in FIGS. 1 and 2, chamber enclosure and wafer holder embodiments, including wafer substrates, are oriented substantially horizontally, although other orientations are possible. For an embodiment, a natural tendency exists for colder and/or denser growth solution to sink and for hotter and/or less dense growth solution to rise within a chamber enclosure embodiment during operation, which may result in a temperature or composition gradient or gradients. However, in an example embodiment, as shown in FIGS. 1 and 2, an axis of rotation is substantially perpendicular to the direction of gravity. Thus, rotation should provide more effective disruption of temperature and/or composition gradients within a chamber enclosure embodiment, as well as average out potential consequences of existing gradients for growth across a rotating wafer substrate. In a perpendicular substantially vertical orientation, however, an axis of rotation would be parallel with the direction of gravity. In this orientation, rotation of a wafer holder may not be as effective at disrupting temperature gradients in a vertical direction and may not perform as well to average out potential consequences for growth. However, likewise, it is possible that at relatively higher rotation speeds, where growth solution may mix reasonably well, non-horizontal orientations may likewise provide adequate performance. Similarly, in an embodiment, as shown in FIGS. 1 and 2, having wafer substrates oriented substantially vertically oriented may aid growth quality and/or uniformity of properties in that particles and/or bubbles that potentially could adversely affect growth may be less likely to adhere to a wafer substrate surface. However, again, relatively higher rotation speed may be such that substantially non-vertically oriented wafer substrates may provide adequate results.

To provide relatively high purity, corrosion resistance and/or contamination resistance, parts of chamber enclosure 110 to contact growth solution and wafer substrate holder 120 may be formed from materials that are more difficult to corrode and/or contaminate by various fluids to which they may be exposed. For example, such parts may be constructed of fluoropolymer materials, such as Polytetrafluoroethylene (PTFE), Perfluoroalkoxy polymer (PFA), polyethylenetetrafluoroethylene (ETFE), Polychlorotrifluoroethylene (PTFE or CTFE), fluorinated ethylene-propylene (FEP), polyvinylidene fluoride (PVDF), etc. and/or other materials with a relatively high degree of chemical resistance, such as Polyether ether ketone (PEEK), Polyethylene (PE), Polypropylene (PP), sapphire, quartz/fused silica, stainless steel, or combinations thereof. For some parts, elastomeric materials properties may also be desired, such as, for example, parts forming and/or providing a seal, like o-rings, gaskets, etc. These parts may be may similarly comprise fluoro-elastomers, for example, Fluorocarbon Elastomers (FKM), Perfluorinated Elastomers (FFKM), fluoro-silicone, etc., or combinations thereof. Besides potential failure of a part, corrosion and/or dissolution of materials into a fluid during operation, such as synthesis of material, could lead to contamination, other modification of material being grown and/or other unintended effects.

Of course, it is intended that claimed subject matter not be limited in scope to example embodiments, provided primarily for purposes of illustration. Thus, an embodiment previously described, such as shown in FIGS. 1 and 2, includes an embodiment of a wafer substrate holder in which positioned at separate locations along an axis of rotation, such as axis 140, individually separate wafer substrates are in place. However, as an example, in an alternative embodiment, in a single, common plane positioned at a particular, separate location along an axis of rotation and positioned with the axis of rotation located at the center may be an array of multiple wafer substrates located substantially in the same (e.g., common) plane. Likewise, a substantially similar arrangement may be included in substantially parallel planes spaced apart along the axis of rotation. For example, advantages of such an embodiment may include an ability to accommodate wafer substrates of different sizes and/or shapes, and/or an ability to accommodate a larger number of smaller wafers within a chamber enclosure embodiment that is also able to accommodate larger wafers in a single wafer per plane arrangement. However, potential disadvantages may include a reduced efficiency, in terms of a ratio of wafer surface area to chamber volume, and potentially less uniformity in temperature and/or chemical composition in comparison to the previous embodiment; nonetheless, it may still provide adequate results.

Figure 3:
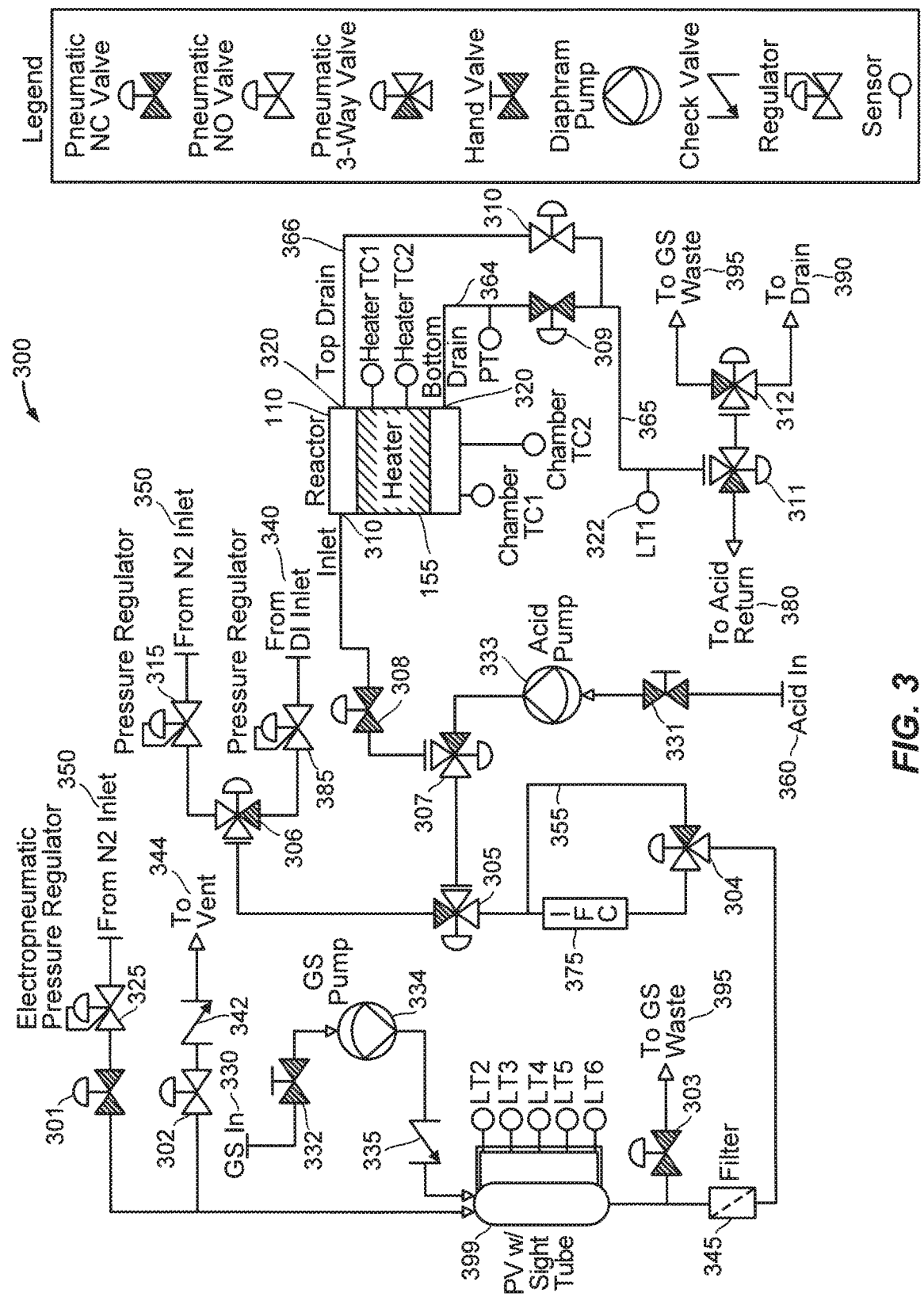
FIG. 3 is a schematic diagram of an embodiment of a fluid handling system (FHS), including a chamber enclosure, capable of use to synthesize zinc oxide.

An embodiment of a fluid handling system (FHS) for a relatively low temperature aqueous solution zinc oxide growth system (ZGS) is shown in FIG. 3. In an embodiment, a FHS may comprise an interconnected network of fluid lines, fluid valves, one or more process parameter sensors, one or more pressure vessels, one or more fluid pumps, one or more fluid sources and/or one or more fluid drains forming a programmable closed fluid handling system (FHS). In an embodiment, an interconnected network may connect to a fluid sealable growth chamber enclosure, such as chamber enclosure 110, such as by connecting to at least one inlet port, such as inlet port 310 and connecting from at least one outlet port, such as outlet port 320 (although, as later discussed outlet port 320 comprise two drains). In an embodiment, one or more process parameter sensors may comprise at least one of the following: a fluid flow sensor, a fluid pressure sensor, a fluid temperature sensor, an optical sensor, a fluid pH sensor, a fluid conductivity (or resistivity sensor) or any combinations thereof. In an embodiment, a programmable closed fluid handling system (FHS) may be capable of being programmed in advance, such as via a control system. In an embodiment, a control system capable of being programmed in advance may at least comprise: a processor and a non-transitory memory mutually connected via a communications bus, the non-transitory memory to store executable instructions, such as computer instructions, to be fetched and executed by the processor. Likewise, in an embodiment, a control system may be at least in part to store instructions, such as computer instruction, to execute a particular zinc oxide growth process formulation (GPF), for example. In an embodiment, a particular zinc oxide GPF may specify zinc oxide synthesis process-related parameters to be employed for execution of the particular zinc oxide GPF. For example, the particular zinc oxide GPF may specify one or more paths for fluid flow within an embodiment of a FHS with respect to presence of particular conditions, which may, for example, be assessed via sensors and/or signals, during execution of a particular zinc oxide GPF. Likewise, a particular zinc oxide GPF may specify one or more paths for fluid flow within an embodiment of a FHS at particular times during execution of a particular zinc oxide GPF. A specified path for fluid flow may include a path to flow fluid from one or more fluid sources and/or a path to flow fluid to one or more fluid drains. Likewise, a particular zinc oxide GPF may specify zinc oxide synthesis process-related parameters to include specification of a temperature signature and/or a pressure signature for growth solution while within chamber enclosure 110 for the particular zinc oxide GPF. The term "signature" refers to a particular quantity characteristic such that it describes how the quantity may vary over a period of time. Likewise, a particular zinc oxide GPF may specify a rotational speed signature, which may at least comprise chamber rotation speed for a time period for growth solution while contained within chamber enclosure 110. Furthermore, an embodiment comprising an interconnected network forming a programmable closed FHS may include a path to flow fluid to inlet port 310 of chamber enclosure 110 from one or more fluid sources, and/or a path to flow fluid from outlet port 320 of chamber enclosure 110 to fluid drains, and/or to bypass portions of an embodiment of an interconnected network, such as to bypass one or more path of more limited fluid flow, which may be for a variety of reasons, such as an integrated flow controller being along a path, for example.

Referring to FIG. 3, for example, an embodiment of a FHS may comprise at least one growth chamber enclosure, such as 110, with at least two ports allowing for entry and exit of fluids, such as inlet port 310 and outlet port 320, respectively. It is noted that in FIG. 3, outlet port 320 comprises two drains, a top drain connected to a fluid line 366 and a bottom drain connected to a fluid line 364. Likewise, in an embodiment, a FHS comprises at least one of the following connected by fluid lines to chamber enclosure 110: a growth solution source 330, a rinsing fluid source 340, and/or a purge gas source 350. An embodiment may also optionally comprise a cleaning fluid source 360. An embodiment may further comprise at least one fluid line 365 to connect to a collection vessel or waste drain. Growth fluid source 330 provides a fluid that, for example, if heated in chamber enclosure 110, alone or in combination with other fluids, may result in material synthesis on a surface of a wafer substrate, such as growth of ZnO.

In an embodiment, for example, a fluid from growth solution source 330 may comprise an aqueous solution of dissolved ammonia and Zn(II) species that, if heated, results in synthesizing ZnO in crystalline form, such as previously described, for example. Likewise, in an embodiment, purge gas source 350 may comprise a pressurized supply of gas capable of flowing to be used to purge fluids from components of an embodiment of a FHS. For example, to reduce risk of an adverse interaction, such as with other fluids and/or with wafer substrates, a substantially non-reactive gas with such fluids and/or wafer substrates, under conditions existing in an embodiment of a FHS, may be employed. Thus, for example, a purge gas may comprise clean and dry nitrogen gas and/or air, for example. Rinse fluid source 340 in an embodiment may provide a fluid to rinse away and/or dilute other fluids in an embodiment of a FHS. A rinse fluid may comprise deionized (DI) water, for example.

An embodiment of a FHS shall also include mechanisms to flow fluid along a path from one location to another. For example, an embodiment of a FHS may include a capability to generate a pressure differential between different locations along a path in an embodiment of a FHS to flow fluid through fluid lines connecting those locations. Thus, for example, in an embodiment, a growth solution source, a cleaning fluid source, a rinse fluid source, and/or a purge gas source may be pressurized relative to a chamber enclosure, and relative to other downstream collection vessels and/or drain lines. For example, sources may be pressurized to higher than atmospheric pressure; likewise, a chamber enclosure, downstream collection vessels and/or drain lines may be pressurized to atmospheric pressure.

However, for the embodiment shown in FIG. 3, this is not the case. In this example, growth solution source 330, and cleaning fluid source 360 need not be pressurized relative to chamber enclosure 110. As described in more detail later, growth solution is pumped by 334 into pressure vessel 399, which is then pressurized by 350, so a pressure differential is between vessel 399 and chamber enclosure 110. Likewise, cleaning solution 360 is pumped by 333 directly to chamber enclosure 110. Thus, both 360 and 110 can be at substantially the same pressure, such as atmospheric pressure in this embodiment.

Nonetheless, pressure regulation valves may be used to affect pressure at least in part in an embodiment of a FHS. Similarly, pressure gauges and/or transducers may be used to monitor pressure. Pressure regulation valves, for example, may comprise electronically adjustable pressure regulation valves, capable of setting pressure at least approximately as a function of a control signal, such as an electronic control signal. Pressure gauges and/or transducers may also comprise electronic devices capable of generating a control signal indicating a measured pressure. Furthermore, electronic pressure adjustment and sensing may be integrated in a single device with an internal control loop, or may be connected using an external control loop. Pressurization of fluid may also be provided external to an embodiment of a FHS. For example, rinse fluid source 340 may comprise an external supply of pressurized rinse fluid, or purge gas source 350 may comprise a pressurized supply of gas. Pressurization of a fluid may also be provided and/or produced internally with respect to an embodiment of a FHS, such as via a booster pump and/or compressor, for example. Pressurization of a fluid may also be provided and/or produced internally via or the transfer of pressure from another externally or internally pressurized fluid, for example. Referring to FIG. 3, for example, growth solution if contained in pressure vessel 399 may be pressurized by nitrogen gas from purge gas source 350 with pressure regulated by electro-pneumatic pressure regulator 325, as described later in more detail. It is noted that pressure may be adjusted and/or monitored a variety of ways and claimed subject matter is not intended to be limited in scope to a particular approach.

Various types of pumps, for example, positive displacement pumps and/or velocity pumps may also be used to drive fluid flow between different locations along a path in an embodiment of a FHS without necessarily generating a pressure differential between those different locations. Thus, as an example, a positive displacement pump may be used to move fluid from a fluid source along a path to a chamber enclosure, such as 110, with both fluid source and chamber enclosure at substantially the same pressure, such as, for example, atmospheric pressure. As one non-limiting example, a diaphragm pump, such as a KNF model UNF-300 pump, available from KNF NEUBERGER, INC., located at Two Black Forest Road, Trenton, N.J., may be employed, In an embodiment, a FHS may comprise a configuration of fluid lines, fluid connections and fluid valves, for example, so as to select fluid from one or more sources, such as listed above, for example, in which selected fluid(s) may be permitted to enter a chamber enclosure, such as 110. For example, an embodiment may comprise a 3-way valve, such as 305, to select flow from growth solution source 330 or from a second fluid line to pass through to chamber enclosure 110. That second fluid line in turn, for example, may be connected to a common port of another 3-way valve 306 that selects between flow from rinse fluid source 340 and purge gas source 350. Downstream from a common port of 305 is a third 3-way valve 307 that selects between fluid flow selected by 3-way valve 305 and cleaning fluid source 360. In a configuration such as the one described above, a fluid line shared by multiple fluids may be rinsed with rinse fluid and purged with purge gas. As a non-limiting example, a 3-way valve may comprise a Entegris model Galtek SG4-3C pneumatically operated valve, for example, available from Entegris, Inc., 129 Concord Road, Billerica, Mass.

Similarly, in an embodiment, a FHS may direct fluid flow exiting chamber enclosure 110 along a path to one or more possible collection vessels and/or drains. For example, fluid exiting chamber enclosure 110 may be directed to a rinse fluid drain port or collection vessel, such as 390, a growth solution drain port or collection vessel, such as 395, and/or a cleaning fluid drain port or collection vessel, such as 380. As mentioned previously, an embodiment may also include multiple drains from chamber enclosure 110 for outlet port 320. For example, a fluid line 364 may be connected near a lowest point of chamber enclosure 110, so all or nearly all liquid may flow out during draining, and a second fluid line 366 may be connected near a highest point of chamber enclosure 110, so that all or nearly all gas may escape if filling chamber enclosure 110 with liquid. Continuing the example, an embodiment may include fluid valves, such as 309 and 310, shown in FIG. 3, for lines 364 and 366 respectively, that may allow or prevent flow through either and/or both of fluid lines and which join downstream to form fluid line 365. Valves 309 and 310, for example, may comprise 2-way pneumatically operated valves, such as Entegris model Galtek SG4-2C or SG4-2U valves, for normally closed or normally open versions, respectively, again, available from Entegris, Inc.

An embodiment of a FHS may also include flow meters and variable flow control valves, to measure and control, respectively, fluid flow in a fluid line. A flow meter may, for example, comprise an electronic flow meter capable of producing a control signal indicating flow magnitude. A variable flow valve may be electronically controlled, capable of setting flow at least approximately as a function of a control signal. A flow meter and variable flow control valve may be integrated as a flow controller, shown in FIG. 3 as 375, with an internal control loop, such as, for example, an Entegris InVue Integrated Flow Controller model NT6510, available from Entegris, Inc.

In an embodiment, a FHS of fluid lines, fluid connections, and fluid valves may also include fluid lines, fluid connections, and fluid valves to allow variable flow valves, integrated flow controllers, and/or other flow limiting components to be bypassed, for example, in appropriate situations in which an increase in flow is desired. For example, if an integrated flow controller is situated on a fluid line between growth solution source 330 and chamber enclosure 110, so as to effectively limit flow to chamber enclosure 110, a bypass fluid line, such as 355, may be used to route fluid around an integrated flow controller, such as 375, to permit higher flow rates. This may be useful, for example, if filling a chamber enclosure with growth solution, a situation in which reducing filling time may be desirable and employing a particular rate of flow may not be an issue.

An embodiment of a FHS may also include inline filtering to remove particulates from one or more fluids. For example, an inline filter 345 may be placed along a fluid line between growth solution source 330 and chamber enclosure 110 to remove particles from growth solution before it enters chamber enclosure 110, which might otherwise contaminate or undesirably disrupt synthesis, for example. Particulates in growth solution, as one example, may act as sites for heterogeneous nucleation and/or growth, which may compete with nucleation and/or growth of material on a wafer substrate. As a result, material quality, desired properties and/or growth rate could be diminished. Similarly, filters may be placed between chamber enclosure 110 and cleaning fluid source 360, rinsing fluid source 350, and/or purge gas source 340.

Similar to chamber enclosure 110, as previously discussed, to provide relatively high purity, corrosion resistance and/or contamination resistance, parts of an embodiment of a FHS (e.g., to potentially contact growth solution) and wafer substrate holder 120 may be formed from materials that may resist being corroded and/or contaminated by various fluids to which they may be exposed. For example, such parts may be constructed of fluoropolymer materials, such as Polytetrafluoroethylene (PTFE), Perfluoroalkoxy polymer (PFA), polyethylenetetrafluoroethylene (ETFE), Polychlorotrifluoroethylene (PTFE or CTFE), fluorinated ethylene-propylene (FEP), polyvinylidene fluoride (PVDF), etc. and/or other materials with a relatively high degree of chemical resistance, such as Polyether ether ketone (PEEK), Polyethylene (PE), Polypropylene (PP), sapphire, quartz/fused silica, stainless steel, or combinations thereof. For some parts, elastomeric materials properties may also be desired, such as, for example, parts forming and/or providing a seal, like o-rings, gaskets, etc. These parts may similarly comprise fluoro-elastomers, for example, Fluorocarbon Elastomers (FKM), Perfluorinated Elastomers (FFKM), fluoro-silicone, etc., or combinations thereof. Besides potential failure of a part, corrosion and/or dissolution of materials into a fluid during operation, such as during material synthesis, could lead to contamination, other modification of material being grown and/or other unintended effects.

As previously discussed, in a particular zinc oxide growth process formulation, a particular growth solution having a particular chemical makeup may be employed. Thus, during synthesis, it may be desirable to not inadvertently alter a chosen chemical composition. For example, changes to chemical composition, such as those at least partially affecting pH, concentration and/or availability of zinc complexing ligands, may at least partially change a solubility differential, such as for a given temperature change, for example, and, thus, may consequently, in the case of ZnO synthesis, for example, alter rate of ZnO crystal growth with a potential to alter resulting ZnO properties from particular properties being sought. One way in an embodiment to accomplish such a result may be through use of an embodiment of a FHS that is "closed," as previously explained. The term "closed" refers to the absence of additional substances being introduced into, or substance being removed from, a process formulation other than via programmed control and/or intentional human intervention. This may be contrasted with other fluid handling systems, such as an open bath, for example, in which substances may be processed and in which contact with and/or introduction of additional substances, that may otherwise not be explicitly included in the process, or loss of volatile components, such as water or ammonia vapors, as examples, from a fluid handling system, may occur.

Likewise, another way in an embodiment to reduce risk of inadvertently having such changes may be through use of process sequencing of an embodiment of a closed FHS, as described in more detail below. The term "process sequencing," such as with respect to process operations, refers to a planned order of process, operations, such as in a process embodiment, a series of process embodiments, and/or embodiments of one or more sequences of process operations, so as to take care not to inadvertently introduce unplanned substances and/or otherwise produce unplanned chemical and/or physical effects, such as through process interactions that might otherwise occur without careful planning and/or attention. To assist in process sequencing, for example, an embodiment may provide various alert indicators and/or other types of indications to operators regarding state of the FHS and/or components thereof, regarding presence of hazardous conditions with respect to operation of a ZGS, and/or regarding progress of particular processes, progress of sequences of process operations, and/or progress of operations. For example, indicator lights may signal that caustic fluid, such as acid, may be present and/or flowing. Likewise, indicator lights may signal that potentially hazardous growth solution at a relatively high temperature and/or pressure may be present and/or flowing. Likewise, status, state and/or progress of particular processes, progress of particular sequences of process operations, and/or progress of particular operations may also be provided via a system interface (SI), such as via a graphical user interface (GUI), for example. As a result, appropriate process sequencing may protect zinc oxide grown or other components of wafer substrates from damage and/or contamination that could occur from unwanted exposures and/or interactions, as well as protect components of a fluid handling system, as well as human operators interacting with the fluid handling system, from potentially unsafe or damaging conditions.

Figure 4:
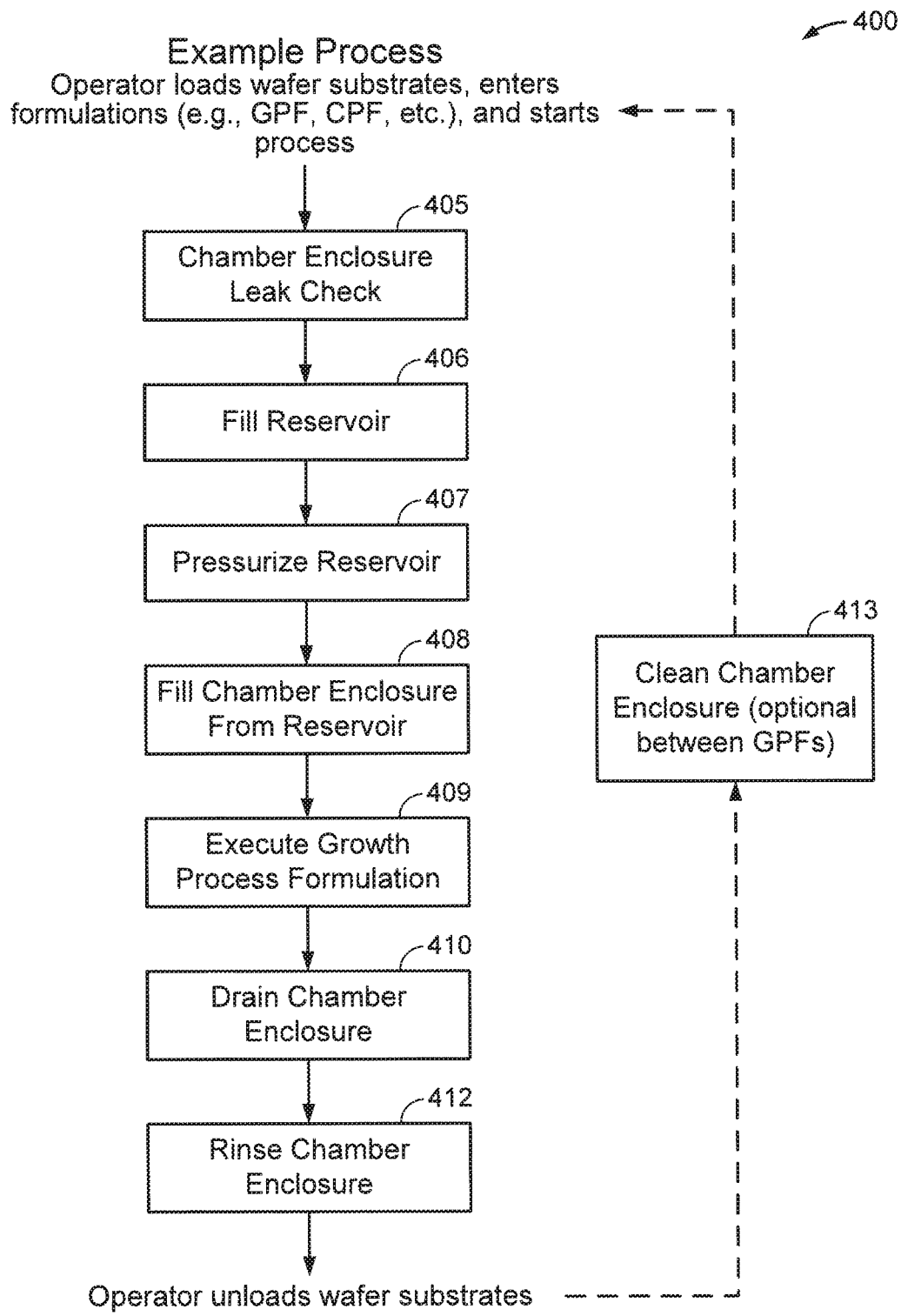
FIG. 4 is a flow chart showing, at a high level, an embodiment of a process to synthesize zinc oxide.

Thus, FIG. 4 is a flowchart of an embodiment 400 of an example process that includes a sequence of process operations to be executed, including process operations for a growth process formulation (GPF), a rinsing process formulation (RPF), a gas purging process formulation (PPF) and a cleaning process formulation (CPF). Likewise, FIGS. 5-13 are additional flowcharts illustrating more detail for sequences of process operations to be executed, such as shown in FIG. 4.

For a process embodiment, one or more sequences of process operations may involve execution of pre-growth process operations by an embodiment of a fluid handling system (FHS) of an embodiment of a relatively low temperature aqueous solution zinc oxide growth system (ZGS) to prepare an embodiment of a ZGS for execution of a particular zinc oxide GFP. A sequence may, for example, include execution of process operations to verify adequate fluid sealing of a fluid sealable chamber enclosure. Likewise, a sequence may include execution of process operations to fill an unpressured, empty vessel or a partially empty vessel with zinc oxide growth solution and to then, after filling, pressurize the vessel containing the zinc oxide growth solution. Likewise, a sequence may include execution of process operations to transfer zinc oxide growth solution from a pressurized vessel to a chamber enclosure for zinc oxide growth/synthesis.

Similarly, in an embodiment, a sequence of process operations may involve execution of a zinc oxide GPF and may involve execution of post-growth process operations in an embodiment of a fluid handling system (FHS) of an embodiment of a relatively low temperature aqueous solution zinc oxide growth system (ZGS) so that an embodiment of a FHS is placed in a state to begin pre-growth process operations for another growth cycle, such as another GPF cycle. A sequence may include execution of chamber enclosure operations to implement a particular zinc oxide GPF for a fluid sealed chamber enclosure containing zinc oxide growth solution. Likewise, a sequence may include execution of process operations to drain a chamber enclosure of zinc oxide growth solution after completing chamber enclosure operations for a particular zinc oxide GPF.

A sequence may further include execution of post-growth process operations to place an embodiment of a FHS in a state to begin pre-growth process operations for another zinc oxide growth cycle, such as another GPF cycle. A sequence may include execution of post-growth process operations, such as: operations to gas purge portions of an embodiment of a FHS; operations to rinse portions of an embodiment of a FHS, including a chamber enclosure; and/or operations to clean a chamber enclosure. For example, sensors, such as fluid pH sensors and/or fluid conductivity (or resistivity) sensors in a FHS may assist through measurements to assess whether adequate rinsing of portions of a FHS, of a chamber enclosure and/or of a wafer substrate holder, for example, has taken place, before undertaking another sequence of process operations.

For example, in an embodiment, process sequences, may include execution of one or more the following:
    filling and/or draining of a chamber enclosure, such as with respect to various fluids;
    temperature and/or pressure adjustment of fluids while contained in a chamber enclosure;

rotation of a wafer substrate holder in a chamber enclosure also containing one or more fluids, such as growth solution;

executing multiple programmed (e.g., pre-programmed) process operations, such as in connection with a variety of growth process formulations (GPFs); and cleaning and/or rinsing a chamber enclosure and/or other components of a fluid handling system.

Process embodiments, including embodiments of sequences of process operations, for example, may be initiated and monitored, and certain process-related parameters to be used may be set in advance, such as user-selectable process-related parameters, which may be set via a system interface (SI) that may include a graphical user interface (GUI), for example. In an example embodiment, a system interface may include a touch sensitive display, for example. Through a SI, a user may use process-related parameters to set certain process conditions, for example, by creating a process formulation, such as for growth (e.g., GPF) and/or cleaning (e.g., CPF), as examples, which may be stored for later reuse, such as in memory of a control system. As described in more detail below, in an embodiment, for example, a control system may comprise at least one processor and at least one memory connected and in communication via at least one communication bus. A process formulation may comprise, for example, of a sequence of process operations, with one or more modifiable set-points for a process operation, for example. Modifiable set points may include, for example, temperature controller set points, pressure controller set points, wafer holder speed rotation set points, flow controller set points, and/or time increment set points. Material growth on a substrate wafer may be relatively sensitive to one or more process formulation set points, so that having accurate and precise repeatability for quality output product, for example, is desirable. In addition, a process-related parameter may, for example, employ proportional, integral, and derivative (PID) gains used for a proportional-integral-derivative control loop implementation, such as, for temperature adjustment, as one example. After being generated, a process formulation, such as a growth process formulation, may be stored and initiated via a system interface, for example, in an embodiment.

Referring now to FIG. 4, for example, and embodiment 400, an operator may load substrate wafers into a substrate holder, such as 120, as previously described, which may then be loaded into a chamber enclosure, such as 110. A chamber enclosure may connect to an embodiment of a FHS, such as embodiment 300 shown in FIG. 3, for example. Likewise, a control system, such as a processor connected to a memory, as described above, having appropriately stored instructions, such as computer instructions, to be fetched and executed by the processor, may be loaded with a process formulation generated by an operator, such as a GPF and/or CPF, for example, as well as formulations to rinse and/or purge via gas.

Likewise, after process initiation, a sequence of initial process-related tasks, including safety check tasks, may be performed. Thus, block 405 refers to a leak check for a chamber enclosure, such as 110. Block 405 is shown in more detail in FIG. 5, which illustrates embodiment 500 for a leak check. For example, an embodiment may perform a check to make sure a chamber enclosure, such as 110, is tightly sealed and fill and pressurize a fluid reservoir pressure vessel, such as 399 of FIG. 3. For example, a check to make sure a chamber enclosure is tightly sealed may comprise pressurizing a chamber enclosure with purge gas and monitoring pressure to confirm that it stabilizes and does not continue to drop, indicating a sealed chamber.

Figure 5:
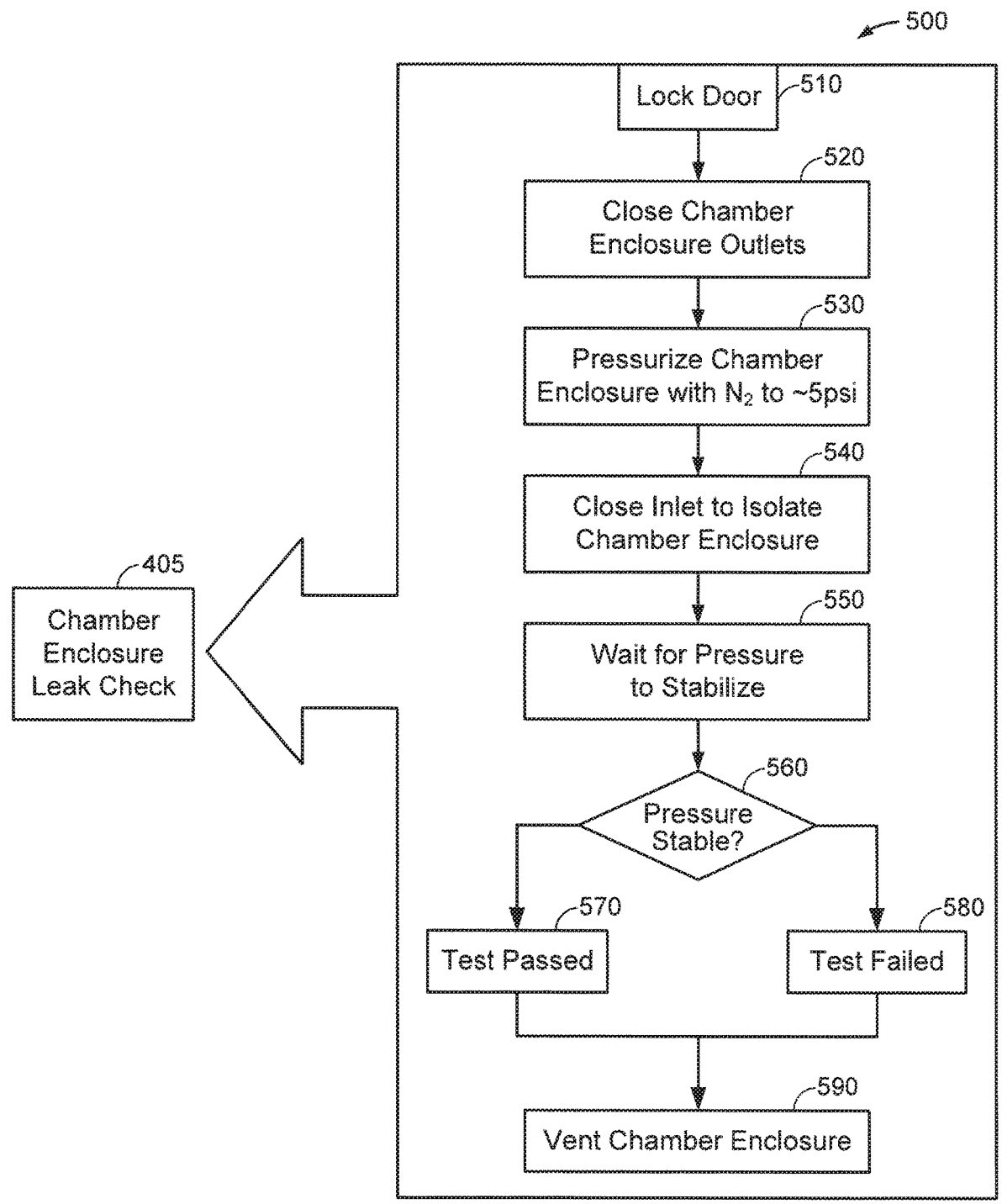
FIGS. 5-13 are flow charts showing in more detail particular embodiments of particular operations from the embodiment of FIG. 4.

Referring to the embodiment shown in FIG. 3, for example, this would entail actuating 3-way valves 305, 306, and 307 to open a path from an $N_2$ regulator 315, such as to valve 308, opening valve 308, and closing valves 309 and 310, which corresponds to blocks 510 and 520 of FIG. 5. Pressure is measured using pressure transducer "PT" on the "bottom drain" line between chamber enclosure 110 and valve 309. If pressure exceeds a set psi, for example, 5 psi, valve 308 is closed, corresponding to block 540 of FIG. 5. Pressure is monitored to evaluate against failure criteria, such as, for example, a rate of pressure decay and/or failure to remain stable within a set resolution and time period, referring to blocks 550 and 560 of FIG. 5. If the criteria or test is failed, then an embodiment may terminate the particular process sequence and/or repeated until passed, referring to blocks 570, 580 and 590 of FIG. 5. Checking that chamber enclosure 110 is able to maintain a pressure before filling with fluid reduces risk of a leak of a potentially hazardous fluid, such as heated growth solution or cleaning fluid, for example.

In an embodiment, a fluid reservoir pressure vessel may be filled, for example, by pumping growth solution from a separate or external fluid reservoir into an unpressurized pressure vessel. Shut off may be affected by signaling and/or sensors. For example, a sensor may be employed to detect liquid in a sight tube connected to pressure vessel 399 and by positioning at an appropriate shut-off level. A sensor may comprise, for example, an optical sensor to detect presence of liquid in a transparent tube via a refractive effect on light along an optical path through the tube. For example, a sensor may generate a signal as a result of liquid being present and, via a control system, as previously described, for example, as a result of the signal generated by the sensor, a pump may cease operation in an embodiment. As an example, an OMRON model EE-SPX613 sensor is available from Omron Corporation, an electronics company based in Kyoto, Japan. Because this type of sensor is placed on the outside of a fluid line, it does not contaminate fluid or otherwise interfere with fluid flow, providing another advantage.

Figure 6:
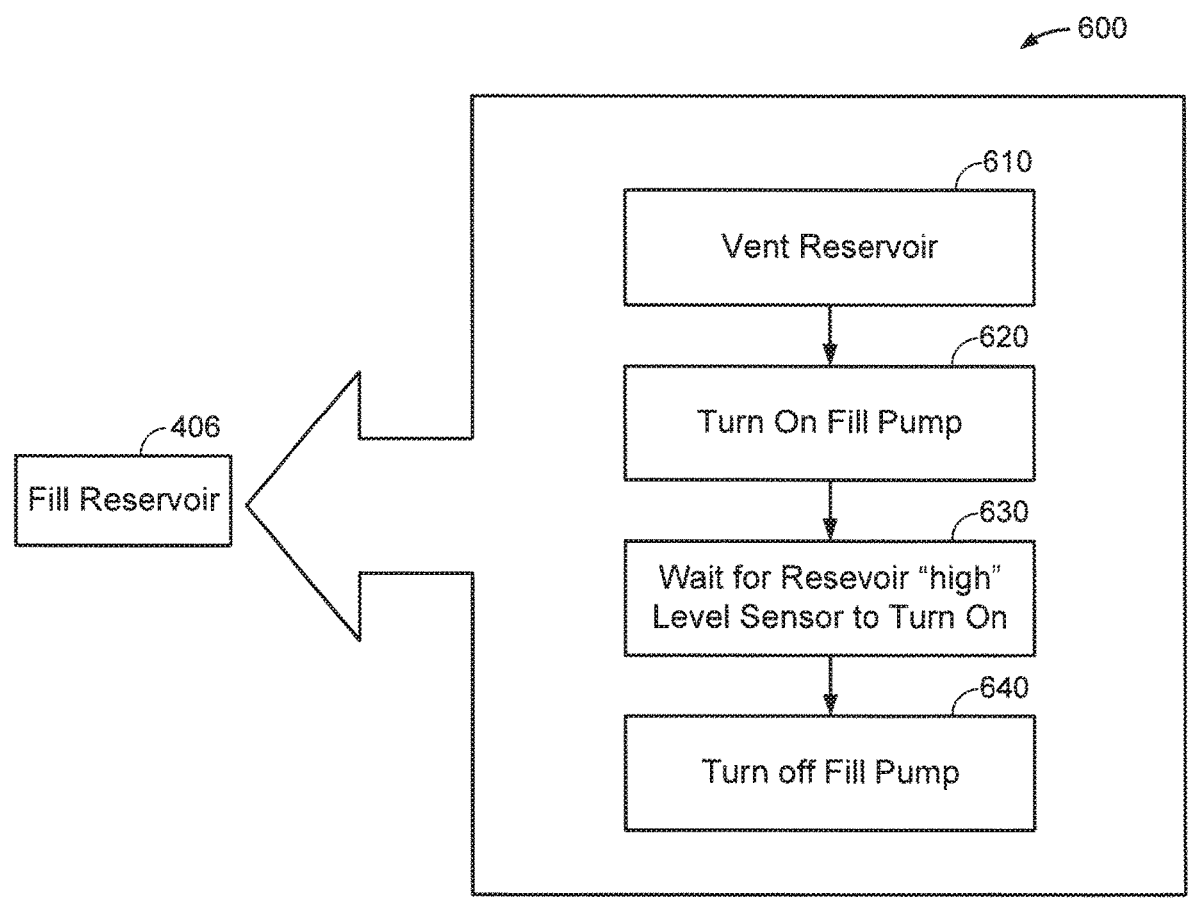
Figure 7:
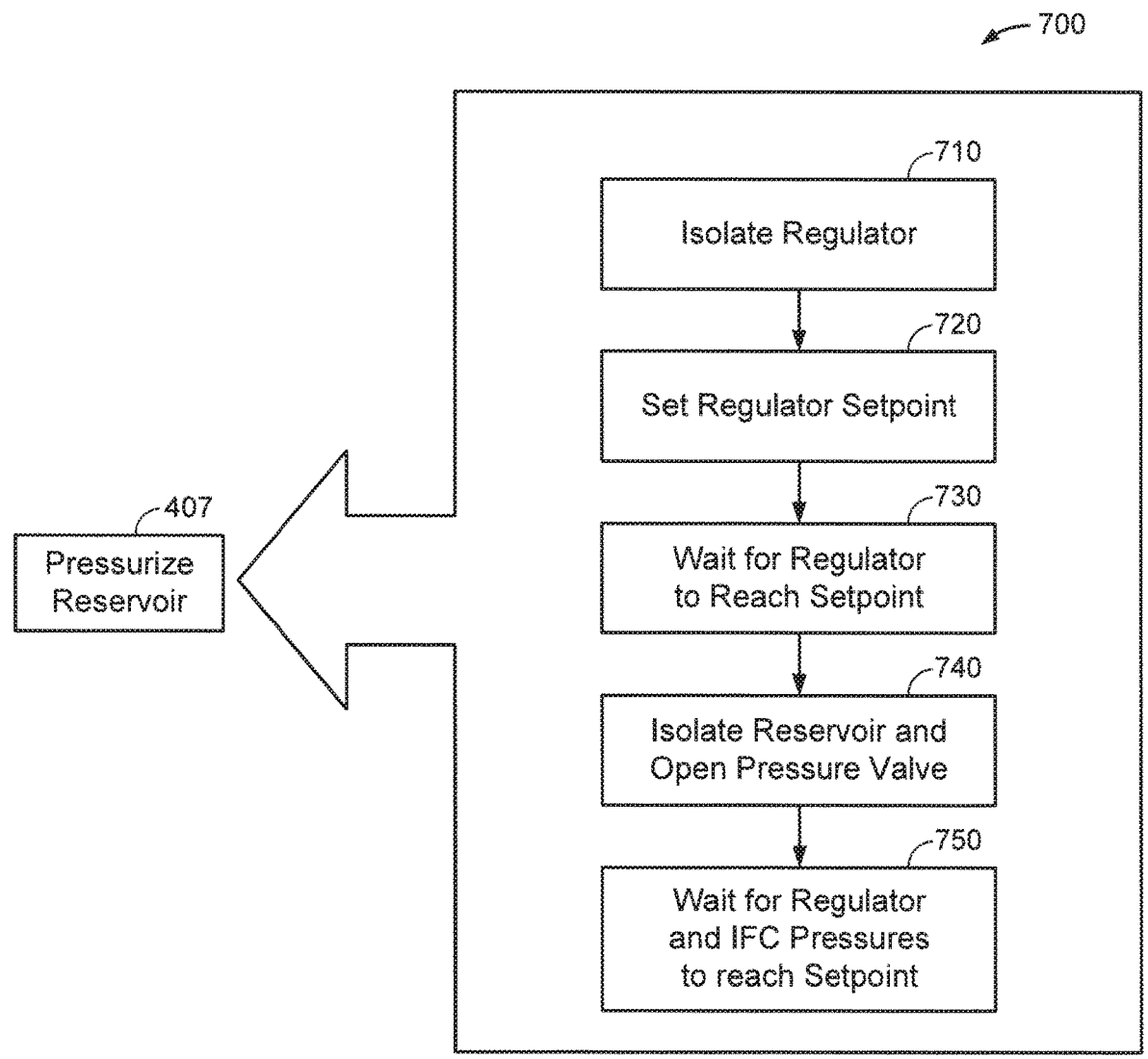

FIG. 6 illustrates a flow chart for an embodiment, also corresponding to block 406 of FIG. 4. Filling a pressure vessel, in an embodiment, may include opening a hand valve, such as 332, between growth solution source 330 (shown as "GS In") and "GS Pump" pump 334, opening valve 302, and closing valves 301, 303, and 304. "GS Pump" 334 is then activated, pumping growth solution into pressure vessel 339. Air or gas in pressure vessel 339 may escape through valve 302 and check valve 342 leading to vent line 344. This process operation corresponds to blocks 610 and 620 illustrated in FIG. 6. Sensors for a sight tube labeled "LT2"-"LT6" may track progress of filling of pressure vessel 399. Thus, for an embodiment, a control system may shut off pump 334 based at least in part on a signal generated from a sensor indicating a level of fluid, corresponding to blocks 630 and 640 of FIG. 6. In an embodiment, a level for shutoff may be set, for example, to fill pressure vessel 399 with sufficient growth solution for a growth process formulation or pressure vessel 399 may be maintained at a "topped off" level, for example.

After being filled, pressure vessel 399 may be pressurized to an appropriate pressure using an electro-pneumatic regulator, such as 325 in FIG. 3. For example, regulator 325 may first be isolated by closing downstream valves via signals generated from a control system, corresponding to block 710 of FIG. 7. Regulator 325 receives a pressure set point, typically via an electronic signal, corresponding to block 720. A regulator valve of 325 may be adjusted until a regulator pressure transducer measurement corresponds to the particular set point pressure, indicated by block 730 of FIG. 7. Valves separating regulator 325 and pressure vessel 399 may then be opened, with regulator 325 and pressure vessel 399 being isolated from other portions of the FHS embodiment of FIG. 3 by additional closed valves, corresponding to block 740. A measurement of a second pressure transducer may then be employed to determine if pressure vessel 399 is pressurized. For example, one may be incorporated into integrated liquid flow controller 375 downstream from regulator 325. If the second pressure transducer signals that pressure vessel 399 is at the pressure set point, pressure vessel 399 has been successfully pressurized, corresponding to block 750. For example, in the FHS embodiment of FIG. 3, "electro-pneumatic pressure regulator" 325 may be isolated by closing valve 301. Valves 302, 303, and 308 may be closed, valve 304 may be actuated to create a path from pressure vessel 399 to "IFC" 375, and valves 305 and 307 may be actuated to provide a path from IFC 375 to valve 308. Valve 301 may be opened to pressurize pressure vessel 399 after regular 325 has stabilized to the pressure set point. Pressure at the pressure transducer integrated in "IFC" integrated flow controller 375 may be monitored via a control system until pressures correspond. It is noted, of course, that alternatively, a separate pressure transducer other than IFC 375 could be employed in an embodiment.

Figure 8:
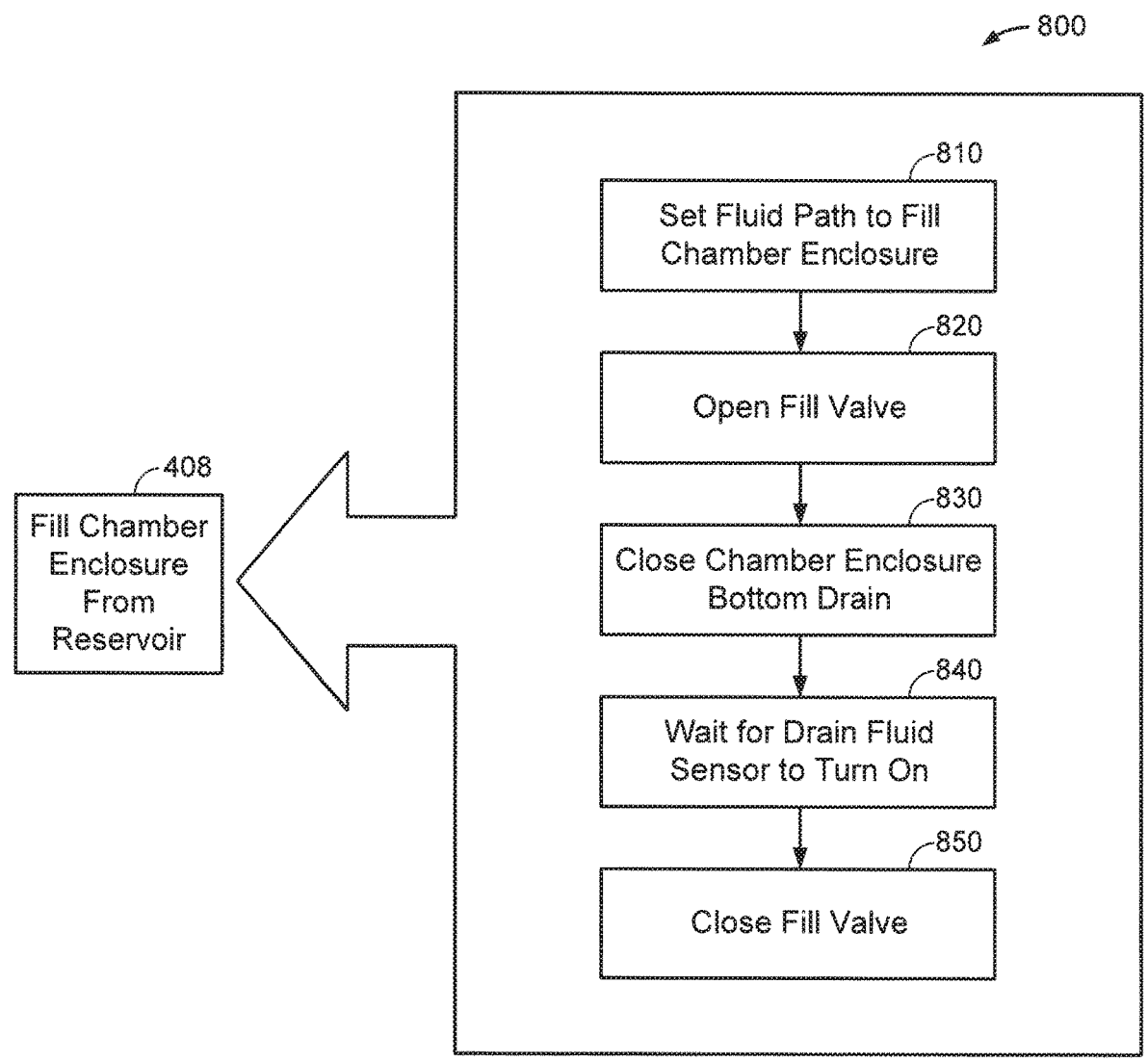

In an embodiment, appropriate signals may be generated to actuate valves, such as shown in the embodiment of FIG. 3, for example, to open a path for fluid flow from pressure vessel 399 to chamber enclosure 110, as also shown by block 810 of FIG. 8. Valves connected to drain port lines near the lowest point of chamber enclosure 110 (e.g., 309 on line 364) may be closed and valves connected to drain port lines near the highest point of chamber enclosure 110 (e.g., 310 on line 366) may be opened, allowing gas to escape as chamber enclosure 110 is filled with growth solution, as shown by blocks 820 and 830. Chamber enclosure 110 may continue to fill with liquid until a sensor placed on an outlet port fluid line generates a signal indicating that liquid has started to flow, as shown by block 840. For example, again, an optical sensor may detect liquid in a transparent tube via a refractive effect on light along an optical path through the tube. As was mentioned previously, an OMRON model EE-SPX613 sensor may be employed and is available from Omron Corporation, an electronics company based in Kyoto, Japan. Because this type of sensor is placed on the outside of a fluid line, it does not contaminate fluid or otherwise interfere with fluid flow, providing another advantage, also previously mentioned. In an embodiment, a path for fluid flow between pressure vessel 399 and chamber enclosure may be closed, as indicated by block 850, as a result of a signal generated from detection of liquid, as described above.

For example, referring to the embodiment of FIG. 3, a path for fluid flow from pressure vessel 399 to chamber enclosure 110 may be a result of valves 301, 309 and 310 being open, values 302 and 303 being closed, valve 304 being actuated to divert flow around IFC 375, valves 305 and 307 actuated to create a path from valve 304 to valve 308, and valves 311 and 312 being actuated to provide a path from valve 130 to 395 for growth solution collection, again, indicated by block 810. Valve 308 may then be opened to allow fluid flow, indicated by bock 820. Valve 309 may initially be left open to allow air to be cleared from chamber enclosure 110, but may be closed after a predetermined time or, alternatively, as a result of liquid being detected by sensor 322, as indicated by block 830. Chamber enclosure 110 in an embodiment may continue to fill with liquid. However, after chamber enclosure 110 fills to a level of "Top Drain," corresponding to 320, liquid may flow into the fluid line to valve 310, sensor 322 and to valve 311. In an embodiment, flow may cease as a result of liquid detection by sensor 322, which may signal that chamber enclosure 110 is full.

Figure 9:
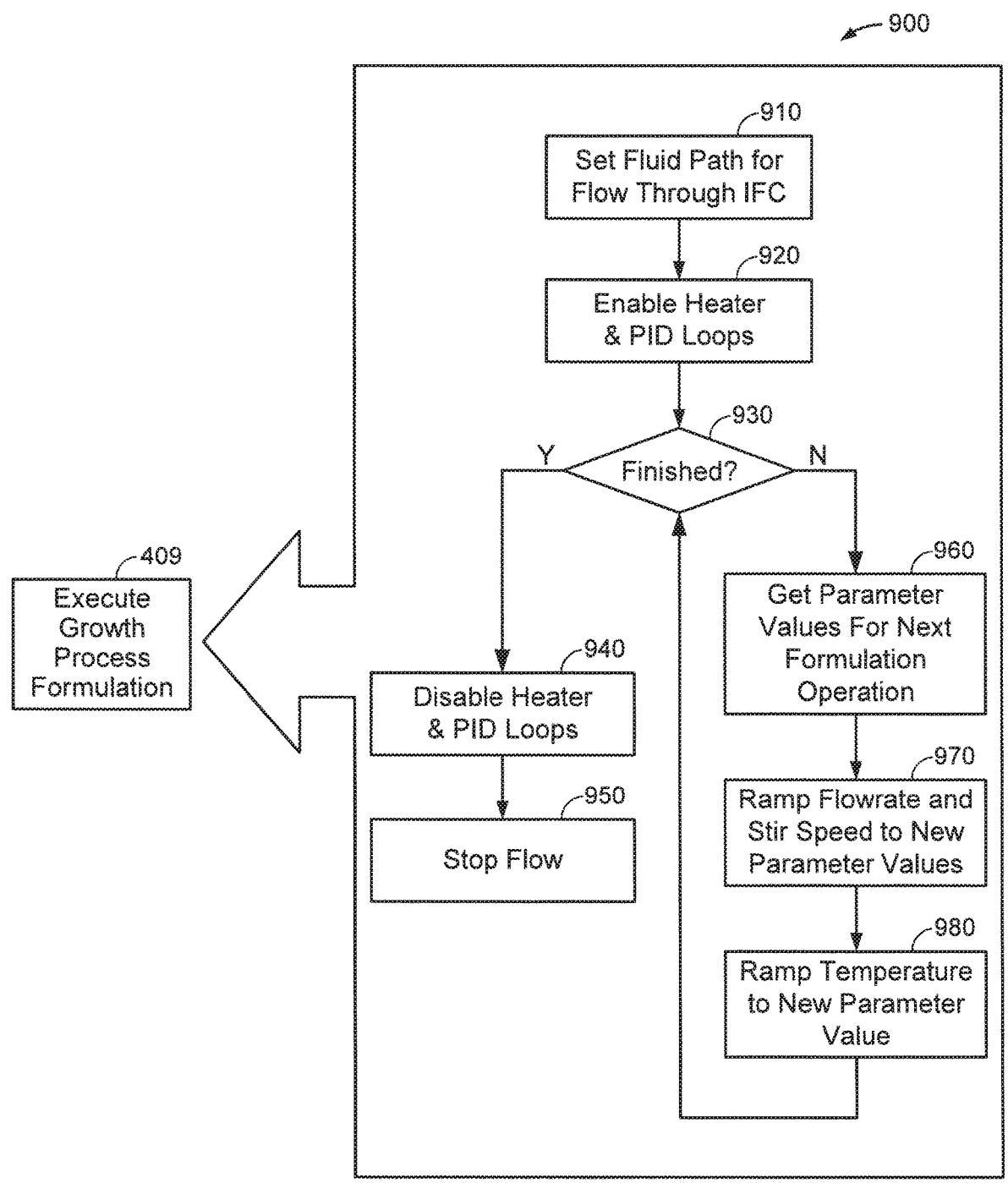
Figure 10:
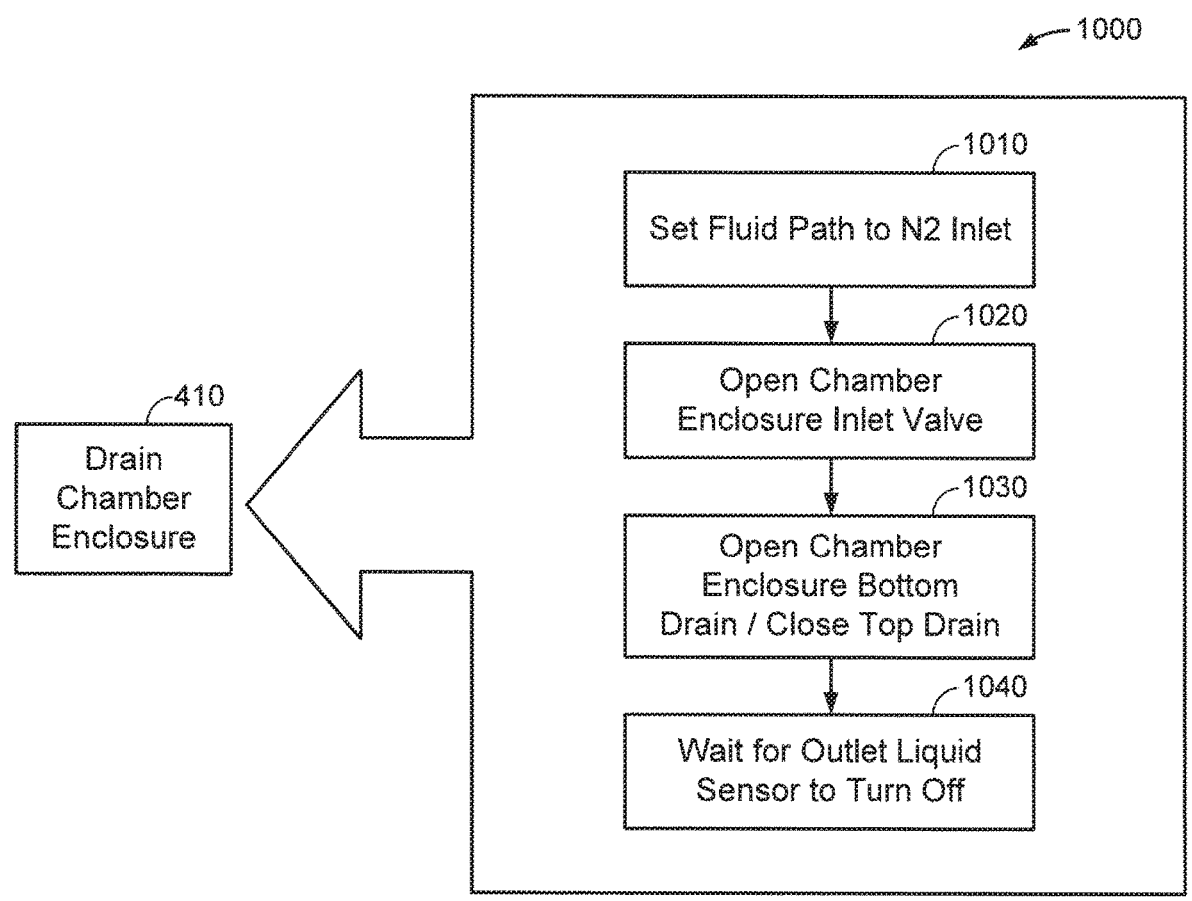

With chamber enclosure 110 full with growth solution, a particular GPF may be implemented, corresponding to block 409 of FIG. 4, and to FIG. 9, which may include employing user-selected process-related parameters, set by a user via a SI, in an embodiment. This may include ramping or maintaining temperature of growth solution in chamber enclosure 110 as a function of time or another variable, rotating wafer substrate holder 120 at a certain rate as a function of time and/or variables, and flowing solution through chamber enclosure 110 at a certain rate as a function of time and/or other variables. Control of flow through chamber enclosure 110 may be accomplished via an integrated flow controller, such as 375 of FIG. 3, discussed in more detail later. Execution of particular GPFs and/or setting of particular GPF conditions in a precise, predictable, and/or repeatable manner for a relatively low temperature aqueous solution synthesis process may affect an ability to obtain desired properties for material to be grown. See, e.g., U.S. patent application Ser. No. 14/341,700, filed Jul. 25, 2014, titled "Fabrication and/or Application of Zinc Oxide Crystals with Internal (Intra-Crystalline) Porosity," by Richardson et al.

An operation for a GPF, for example, may also include non-user selected process-related parameters, so that a control system, for example, may be able to reproducibly execute a desired process embodiment. As simply one example, flow rate of growth solution through chamber enclosure 110 may be determined and employed by an embodiment of a GPF in order to make process sequencing determinations. As another entirely different type of example, a formulation, such as a growth process formulation (GPF), may include parameters for a proportional-integral-derivative controller (PID controller) for achieving stable and/or reproducible temperature adjustment. In an embodiment, such as for a FHS, as shown in FIG. 3, a GPF, for example, using growth solution flow would use largely the same valve configuration previously described in connection with FIG. 8, except valve 304 would be switched for a path of fluid to flow though IFC 375. IFC 375 may, for example, receive a signal, such as from a control system, with a flow set point, and adjust its variable flow valve until a flow sensor measures a flow that corresponds. Flow may be continually maintained in an embodiment by IFC 375 using a feedback loop. A feedback loop may also be used in an embodiment for temperature adjustment of chamber enclosure 110 in an embodiment. In an embodiment, heat may be generated to affect temperature using two thermocouple type temperature sensors, as shown in FIG. 3, to measure temperature of fluid inside chamber enclosure 110 and two thermocouples to measure temperature of an aluminum shell surrounding PTFE walls of chamber enclosure 110, as shown in FIG. 2, in an embodiment. Use of multiple thermocouples to measure two different locations within the fluid inside chamber enclosure 110 and two locations on or in the heated aluminum shell, provides for a metric of temperature uniformity both in the fluid and across the shell, and/or for continual verification of proper thermocouple operation. For an embodiment, temperature may be adjusted using a "cascade" type approach having two feedback loops, a master loop and a slave loop. As an example, a master loop may compare measured liquid temperature with a liquid temperature set point and generate a PID output signal using the difference. The master loop PID output signal may be used to by a slave loop to determine the heated aluminum shell set point to compare with the measured aluminum shell temperature. The difference between the aluminum shell measured temperature and set point temperature may be used to determine the slave loop PID output, which for example, may be the electrical power supplied to an electric heater providing heat to the aluminum shell. Liquid within a chamber enclosure may be relatively slow to heat and cool, so a master loop may typically use a slower cycle time than a slave loop. Thus, if liquid is too cool, more heat is generated and if liquid is too hot, less heat is generated. If a motor with a rotation speed sensor (e.g., an encoder) used, a feedback loop may also be used by a motor controller to maintain a desired wafer substrate holder rotation speed. As previously noted, a feedback loop may also be used by a fluid flow controller. It is likewise noted that in an embodiment in which pressure within chamber enclosure is adjusted in connection with implementation of a particular GPF, similar approaches may also be employed.

After growth process formulation operations, in an embodiment, chamber enclosure 110 may be drained by opening a fluid path to a collection vessel or drain port, such as 395, as shown in FIG. 3. To accelerate draining, a flow of compressed gas to chamber enclosure 110 (e.g., from 355) may be opened. Compressed gas entering chamber enclosure 110 may push growth solution out. A sensor, for example, an OMRON model EE-SPX613 sensor, previously described, on a fluid path to a collection vessel/drain port may sense and signal that liquid is no longer present, indicating that chamber enclosure 110 has been fully drained, corresponding to 1030 and 1040 of FIG. 10. As previously suggested, clearing a path with a purge gas before using that path for flow of a different fluid may reduce risk of an undesirable reaction in fluid lines between different fluids, such as, for example, between growth solution and rinse fluid. Certain mixtures of water and growth solution, for example, could result in precipitation of solid material, such as ZnO, which may be undesirable. Referring to the embodiment of FIG. 3, after a final growth process formulation operation for a particular GPF cycle, valve 308 may be closed to stop solution flow, heater power may be turned off, and wafer substrate holder rotation may be stopped. Valves 305, 306, and 307 may then be actuated to provide a path from pressure regulator 315 to valve 308. Valves 309 and 310 may be open and valves 311 and 312 may be set to allow flow for collection. Valve 308 may be opened allowing pressurized $N_2$ to push growth solution out of enclosure chamber 110. Initially liquid may flow out of both the "Top Drain" and "Bottom Drain" but draining may be slow if the top drain is left open, allowing purge gas collecting at the top of chamber enclosure 110 to also flow out. Thus, valve 310 may be closed after a predetermined amount of time, or if gas bubbles are detected in the fluid line via sensor 322. After liquid has drained out of chamber enclosure, sensor 322 may consistently detect "no-fluid" and may generate an appropriate signal. At this point, chamber enclosure 110 is drained.

Figure 11:
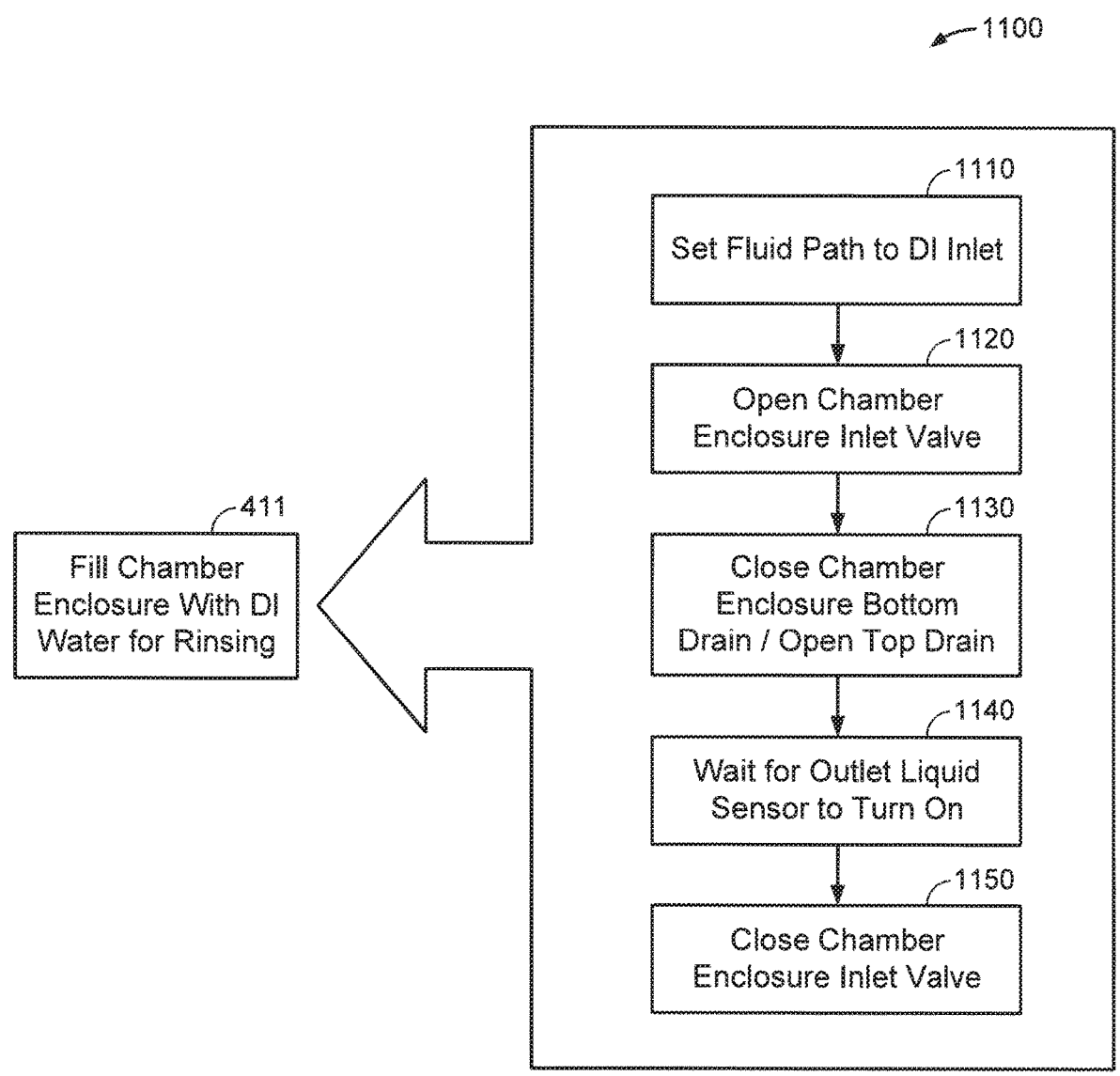
Figure 12:
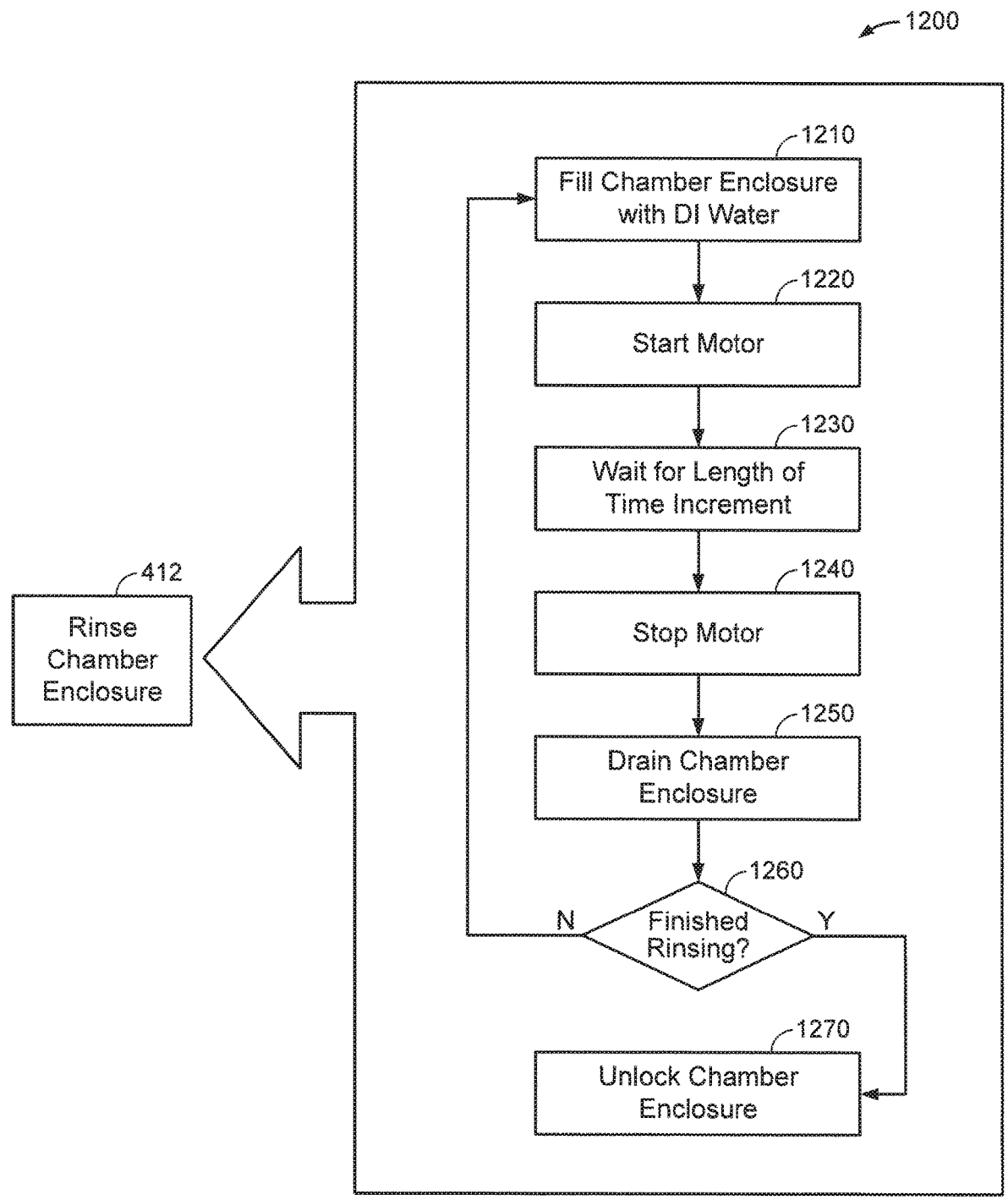

Following drainage of growth solution, chamber enclosure 110 and parts of an embodiment of a FHS, such as parts of embodiment 300, may be rinsed with a rinse fluid, for example, to remove residual growth solution. As previously alluded, sensors, such fluid sensors and/or fluid conductivity (or resistivity) sensors may assist in process sequencing, which may, among other benefits, improve quality and/or safety. For example, an operator may be alerted, such as via indicator lights, an SI, and/or another mechanism, to allow a FHS to remain closed until adequate rinsing and/or removal of hazardous substances has taken place or been completed. A filling process sequence may be used similar to the process sequence used for providing growth solution. Thus, as shown by FIG. 11, a valve configuration may open a path for fluid flow, here, from rinse fluid source 340 to chamber enclosure 110. Likewise, as shown by FIG. 12, wafer substrate holder 120 may be rotated for a set amount of incremental time to assist with rinsing wafer substrates, chamber enclosure 110, and wafer substrate holder 120. Rinse fluid may be drained in a similar manner to the process sequence for growth solution, but with a path for fluid flow being directed to a rinse fluid collection vessel or drain port 390. This process sequence may be repeated for a set number of times, or until a sensor signal indicates adequate rinsing and/or cooling (e.g., temperature, fluid pH and/or fluid conductivity sensor). Residual substances, as indicated, may have a negative impact on properties of grown materials, as well as on safety of operator personnel, so that adequate and/or repeatable rinsing is desirable.

In the embodiment shown in FIG. 3, for example, valves 305, 306, and 307 provide a path from pressure regulator 385 and rinse fluid source 340 to valve 308, Likewise, valves 311, and 312 may be set to provide a path for fluid flow to rinse fluid collection port 390. Valve 308 may be opened to allow rinse fluid to flow to chamber enclosure 110. Previously, both valves 309 and 310 were described to be initially open to allow air to be cleared from chamber enclosure 110, but valve 309 may be closed after a predetermined time, or alternatively after liquid is detected by sensor 322, so that chamber enclosure 110 may continue to fill with liquid. As previously, chamber enclosure 110 is full if liquid is detected by sensor 322, as indicated by blocks 1110 to 1150 of FIG. 11 and block 1210 of FIG. 12. Wafer substrate holder rotation motor may be turned on and set to a speed substantially in accordance with a control system, as indicated by block 1220 of FIG. 12. Rinse fluid may continue to flow while chamber enclosure 110 is full and holder 120 is rotating, or valve 308 may be closed so that rinse fluid may stop flowing to chamber enclosure 110. After a period of time, rinse fluid in chamber enclosure 110 may be drained using a similar process as previously described, corresponding to blocks 1230, 1240 and 1250. Valves 305, 306, and 307 may be switched to allow a path from purge gas source 350. Initially, valves 309 and 310 may be open; but valve 310 may then be closed and draining may continue until sensor 322 detects consistent gas. It is noted a door of chamber enclosure 110 may be locked, such as via a control system, during particular processes, sequences of processes and/or process operations, such as those previously described; for example, for improved safety. Likewise, an operator may be alerted that a chamber enclosure, for example, remains locked, such as via various indicators, which may include, as non-limiting examples, indicator lights, a SI, etc. After a process sequence is completed, for example, it may then be unlocked, as shown, as an example, by block 1270 of FIG. 12, after a full rinsing and/or being cooled. Likewise, various indicators may also inform an operator that engaging with parts of a FHS may be done safely.

Figure 13:
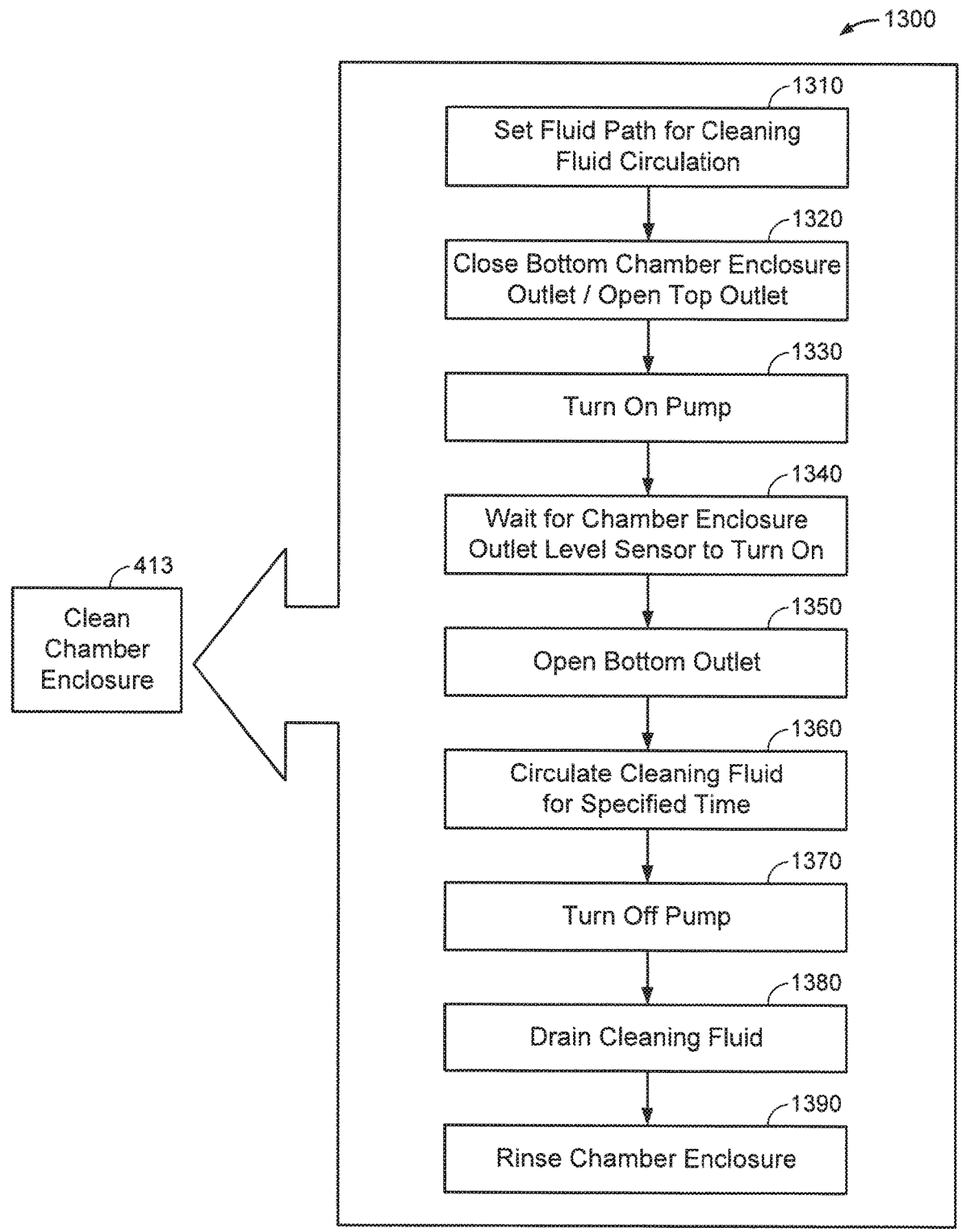

Other types of process sequences besides GPF may be implemented by an embodiment. For example, a cleaning formulation process (CPF) may be implemented as shown in FIG. 13 and block 413 of FIG. 4. In a cleaning process, chamber enclosure 110 may be filled with a cleaning fluid. Cleaning fluid may then be stirred by a rotating wafer substrate holder 120, not loaded with wafers, but heated in a similar manner to the heating of growth solution. For example, material may remain on fluid exposed surfaces after a particular GPF has been completed, for example, which may adversely impact subsequent GPF cycles, for example, by acting as competitive growth sites for material. Thus, use of a cleaning cycle that removes potentially remaining material, such as between cycles of GPFs, may result in more consistent quality and/or material properties. For example, a dilute acid solution, like dilute hydrochloric acid, may be used to remove ZnO material on surfaces exposed to growth fluid. As cleaning fluid, however, may itself contaminate material growth, a rinse sequence similar to that performed after a GPF cycle may also be performed after use of cleaning, as illustrated by block 1390 of FIG. 3.

In the embodiment shown in FIG. 3, as an example, cleaning may be performed by setting valve 307 to allow cleaning fluid to be pumped by pump 333 from cleaning fluid source 360 to valve 308, opening valve 308, and setting valve 311 for a path for fluid flow towards collection point 380. As shown by block 1310, for example, acid supply and return lines may be connected to the same cleaning fluid reservoir since the amount of residual material being removed may be relatively small. Thus, cleaning fluid may be reused multiple times before being replaced, reducing waste, cost, etc. Acid pump 333 may then be turned on and acid cleaning solution may be pumped into chamber enclosure 110. While chamber enclosure 110 is filling, valve 309 may remain closed. However, acid solution may flow out of the top drain and sensor 322 may signal detection of liquid, shown by 1340. Thus, valve 309 may later be opened to have less restricted flow out, shown by 1350. Further, wafer substrate holder rotation motor may be activated to a selected speed while acid pump 333 continues to circulate cleaning fluid, as shown by 1370. After a selected amount of time, pump 333 and the motor may be turned off and chamber enclosure 110 may be drained, shown by blocks 1370 and 1380. For example, valves 305, 306, and 307 may create a path for flow of gas to chamber enclosure 110. Cleaning fluid may as a result flow out through top and bottom drains and through valve 311 to collection point 380. As with other drain processes, valve 310 may close and draining may continue through the bottom drain.

In summary, an embodiment of a system is provided to grow material from a surrounding growth solution on one or more wafer substrates, other substrates, or other surfaces, such as via heating the growth solution to drive a chemical reaction and synthesize the material. In an embodiment, a system includes a chamber enclosure, such as of substantially cylindrical-like shape with a rotational axis oriented horizontally through the cylindrical like shape. A chamber enclosure is capable of being sealed after accepting a wafer substrate holder and capable of heating a liquid growth solution that may also be contained therein. A wafer substrate holder may be loaded with one or more wafer substrates located at set positions with flat surfaces of the wafer substrates oriented substantially normal to the rotational axis and substantially mutually parallel. Furthermore, during operation, the heated liquid growth solution is able to freely flow around and between wafer substrates to permit material growth while the wafer substrate holder rotates within the chamber enclosure about the rotational axis.

An embodiment includes a fluid handling system (FHS) comprising a closed interconnected network of fluid lines, fluid valves, one or more fluid pumps, one or more pressure vessels, one or more process parameter sensors, one or more fluid sources and/or one or more fluid drains (e.g., collection points). A process embodiment may be executed at least in part that includes a FHS, along with a chamber enclosure and a wafer substrate holder, via a control system, to affect the state of various FHS embodiment components and to create paths for fluid flow, such as among various FHS embodiment components, including fluid sources, various collection points and embodiments of a chamber enclosure and a wafer substrate holder.

In the context of the present disclosure, the term "connection," the term "component" and/or similar terms are intended to be physical, but are not necessarily always tangible. Whether or not these terms refer to tangible subject matter, thus, may vary in a particular context of usage. As an example, a tangible connection and/or tangible connection path may be made, such as by a tangible, electrical connection, such as an electrically conductive path comprising metal or other electrical conductor, that is able to conduct electrical current between two tangible components. Likewise, a tangible connection path may be at least partially affected and/or controlled, such that, as is typical, a tangible connection path may be open or closed, at times resulting from influence of one or more externally derived signals, such as external currents and/or voltages, such as for an electrical switch. Non-limiting illustrations of an electrical switch include a transistor, a diode, etc. However, a "connection" and/or "component," in a particular context of usage, likewise, although physical, can also be non-tangible, such as a connection between a client and a server over a network, which generally refers to the ability for the client and server to transmit, receive, and/or exchange communications, as discussed in more detail later.

In a particular context of usage, such as a particular context in which tangible components are being discussed, therefore, the terms "coupled" and "connected" are used in a manner so that the terms are not synonymous. Similar terms may also be used in a manner in which a similar intention is exhibited. Thus, "connected" is used to indicate that two or more tangible components and/or the like, for example, are tangibly in direct physical contact. Thus, using the previous example, two tangible components that are electrically connected are physically connected via a tangible electrical connection, as previously discussed. However, "coupled," is used to mean that potentially two or more tangible components are tangibly in direct physical contact. Nonetheless, is also used to mean that two or more tangible components and/or the like are not necessarily tangibly in direct physical contact, but are able to co-operate, liaise, and/or interact, such as, for example, by being "optically coupled." Likewise, the term "coupled" may be understood to mean indirectly connected in an appropriate context. It is further noted, in the context of the present disclosure, the term physical if used in relation to memory, such as memory components or memory states, as examples, necessarily implies that memory, such memory components and/or memory states, continuing with the example, is tangible.

Additionally, in the present disclosure, in a particular context of usage, such as a situation in which tangible components (and/or similarly, tangible materials) are being discussed, a distinction exists between being "on" and being "over." As an example, deposition or growth of a substance "on" a substrate refers to a deposition or growth involving direct physical and tangible contact without an intermediary, such as an intermediary substance (e.g., an intermediary substance formed during an intervening process operation), between the substance deposited and the substrate in this latter example; nonetheless, deposition or growth "over" a substrate, while understood to potentially include deposition or growth "on" a substrate (since being "on" may also accurately be described as being "over"), is understood to include a situation in which one or more intermediaries, such as one or more intermediary substances, are present between the substance deposited or grown and the substrate so that the substance deposited or grown is not necessarily in direct physical and tangible contact with the substrate.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact, but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion, but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim cope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

With advances in technology, it has become more typical to employ distributed computing and/or communication approaches in which portions of a process, such as signal processing of signal samples, for example, may be allocated among various devices, including one or more client devices, one or more server devices and/or one or more peer-to-peer devices, via a computing and/or communications network, for example. A network may comprise two or more devices, such as network devices and/or computing devices, and/or may couple devices, such as network devices and/or computing devices, so that signal communications, such as in the form of signal packets and/or signal frames (e.g., comprising one or more signal samples), for example, may be exchanged, such as between a server device, a client device and/or a peer-to-peer device, as well as other types of devices, including between wired and/or wireless devices coupled via a wired and/or wireless network, for example.

An example of a distributed computing system comprises the so-called Hadoop distributed computing system, which employs a map-reduce type of architecture. In the context of the present disclosure, the terms map-reduce architecture and/or similar terms are intended to refer to a distributed computing system implementation and/or embodiment for processing and/or for generating larger sets of signal samples employing map and/or reduce operations for a parallel, distributed process performed over a network of devices. A map operation and/or similar terms refer to processing of signals (e.g., signal samples) to generate one or more key-value pairs and to distribute the one or more pairs to one or more devices of the system (e.g., network). A reduce operation and/or similar terms refer to processing of signals (e.g., signal samples) via a summary operation (e.g., such as counting the number of students in a queue, yielding name frequencies, etc.). A system may employ such an architecture, such as by marshaling distributed server devices, executing various tasks in parallel, and/or managing communications, such as signal transfers, between various parts of the system (e.g., network), in an embodiment. As mentioned, one non-limiting, but ell-known, example comprises the Hadoop distributed computing system. It refers to an open source implementation and/or embodiment of a map-reduce type architecture (available from the Apache Software Foundation, 1901 Munsey Drive, Forrest Hill, Md., 21050-2747), but may include other aspects, such as the Hadoop distributed file system (HDFS) (available from the Apache Software Foundation, 1901 Munsey Drive, Forrest Hill, Md., 21050-2747). In general, therefore, "Hadoop" and/or similar terms (e.g., "Hadoop-type," etc.) refer to an implementation and/or embodiment of a scheduler for executing larger processing jobs using a map-reduce architecture over a distributed system. Furthermore, in the context of the present disclosure, use of the term "Hadoop" is intended to include versions, presently known and/or to be later developed.

In the context of the present disclosure, the term network device refers to any device capable of communicating via and/or as part of a network and may comprise a computing device. While network devices may be capable of communicating signals (e.g., signal packets and/or frame such as via a wired and/or wireless network, they may also be capable of performing operations associated with a computing device, such as arithmetic and/or logic operations, processing and/or storing operations (e.g., storing signal samples), such as in a non-transitory memory as tangible, physical memory states, and/or may, for example, operate as a server device and/or a client device in various embodiments. Network devices capable of operating as a server device, a client device and/or otherwise, may include, as examples, dedicated rack-mounted servers, desktop computers, laptop computers, set top boxes, tablets, netbooks, smart phones, wearable devices, integrated devices combining two or more features of the foregoing devices, and/or the like, or any combination thereof. As mentioned, signal packets and/or frames, for example, may be exchanged, such as between a server device and/or a client device, as well as other types of devices, including between wired and/or wireless devices coupled via a wired and/or wireless network, for example, or any combination thereof. It is noted that the terms, server, server device, server computing device, server computing platform and/or similar terms are used interchangeably. Similarly, the terms client, client device, client computing device, client computing platform and/or similar terms are also used interchangeably. While in some instances, for ease of description, these terms may be used in the singular, such as by referring to a "client device" or a "server device," the description is intended to encompass one or more client devices and/or one or more server devices, as appropriate.

Along similar lines, references to a "database" are understood to mean, one or more databases and/or portions thereof, as appropriate.

It should be understood that for ease of description, a network device (also referred to as a networking device) may be embodied and/or described in terms of a computing device and vice-versa. However, it should further be understood that this description should in no way be construed so that claimed subject matter is limited to one embodiment, such as only a computing device and/or only a network device, but, instead, may be embodied as a variety of devices or combinations thereof, including, for example, one or lore illustrative examples.

A network may also include now known, and/or to be later developed arrangements, derivatives, and/or improvements, including, for example, past, present and/or future mass storage, such as network attached storage (NAS), a storage area network (SAN), and/or other forms of device readable media, for example. A network may include a portion of the Internet, one or more local area networks (LANs), one or more wide area networks (WANs), wire-line type connections, wireless type connections, other connections, or any combination thereof. Thus, a network may be worldwide in scope and/or extent. Likewise, sub-networks, such as may employ differing architectures and/or may be substantially compliant and/or substantially compatible with differing protocols, such as network computing and/or communications protocols (e.g., network protocols), may interoperate within a larger network.

In the context of the present disclosure, the term sub-network and/or similar terms, if used, for example, with respect to a network, refers to the network and/or a part thereof. Sub-networks may also comprise links, such as physical links, connecting and/or coupling nodes, so as to be capable to communicate signal packets and/or frames between devices of particular nodes, including via wired links, wireless links, or combinations thereof. Various types of devices, such as network devices and/or computing devices, may be made available so that device interoperability is enabled and/or, in at least some instances, may be transparent. In the context of the present disclosure, the term "transparent," if used with respect to particular communicating devices of a network, refers to the devices communicating via the network in which the devices are able to communicate via one or more intermediate devices, such as of one or more intermediate nodes, but without the communicating devices necessarily specifying the one or more intermediate nodes and/or the one or more intermediate devices of the one or more intermediate nodes. Thus, a network may include the one or more intermediate nodes and/or the one or more intermediate devices of the one or more intermediate nodes in communications and the network may engage in communications via the one or more intermediate nodes and/or the one or more intermediate devices of the one or more intermediate nodes, but the network may operate as if such intermediate nodes and/or intermediate devices are not necessarily involved in communications between the particular communicating devices. For example, a router may provide a link and/or connection between otherwise separate and/or independent LANs.

In the context of the present disclosure, a "private network" refers to a particular, limited set of devices, such as network devices and/or computing devices, able to communicate with other devices, such as network devices and/or computing devices, in the particular, limited set, such as via signal packet and/or signal frame communications, for example, without a need for re-routing and/or redirecting signal communications. A private network may comprise a stand-alone network; however, a private network may also comprise a subset of a larger network, such as, for example, without limitation, all or a portion of the Internet. Thus, for example, a private network "in the cloud" may refer to a private network that comprises a subset of the Internet. Although signal packet and/or frame communications (e.g. signal communications) may employ intermediate devices of intermediate nodes to exchange signal packets and/or signal frames, those intermediate devices may not necessarily be included in the private network by not being a source or designated destination for one or more signal packets and/or signal frames, for example. It is understood in the context of the present disclosure that a private network may direct outgoing signal communications to devices not in the private network, but devices outside the private network may not necessarily be able to direct inbound signal communications to devices included in the private network.

The Internet refers to a decentralized global network of interoperable networks that comply with the Internet Protocol (IP). It is noted that there are several versions of the Internet Protocol. The term Internet Protocol, IP, and/or similar terms are intended to refer to any version, now known and/or to be later developed. The Internet includes local area networks (LANs), wide area networks (WANs), wireless networks, and/or long haul networks that, for example, may allow signal packets and/or frames to be communicated between LANs. The term World Wide Web (WWW or Web) and/or similar terms may also be used, although it refers to a part of the Internet that complies with the Hypertext Transfer Protocol (HTTP). For example, network devices may engage in an HTTP session through an exchange of appropriately substantially compatible and/or substantially compliant signal packets and/or frames. It is noted that there are several versions of the Hypertext Transfer Protocol. The term Hypertext Transfer Protocol, HTTP, and/or similar terms are intended to refer to any version, now known and/or to be later developed. It is likewise noted that in various places in this document substitution of the term Internet with the term World Wide Web ("Web") may be made without a significant departure in meaning and may, therefore, also be understood in that manner if the statement would remain correct with such a substitution.

Although claimed subject matter is not in particular limited in scope to the Internet and/or to the Web; nonetheless, the Internet and/or the Web may without limitation provide a useful example of an embodiment at least for purposes of illustration. As indicated, the Internet and/or the Web may comprise a worldwide system of interoperable networks, including interoperable devices within those networks. The Internet and/or Web has evolved to a self-sustaining facility accessible to potentially billions of people or more worldwide. Also, in an embodiment, and as mentioned above, the terms "WWW" and/or "Web" refer to a part of the Internet that complies with the Hypertext Transfer Protocol. The Internet and/or the Web, therefore, in the context of the present disclosure, may comprise a service that organizes stored digital content, such as, for example, text, images, video, etc., through the use of hypermedia, for example. It is noted that a network, such as the Internet and/or Web, may be employed to store electronic files and/or electronic documents.

The term electronic file and/or the term electronic document are used throughout this document to refer to a set of stored memory states and/or a set of physical signals associated in a manner so as to thereby at least logically form a file (e.g., electronic) and/or an electronic document. That is, it is not meant to implicitly reference a particular syntax, format and/or approach used, for example, with respect to a set of associated memory states and/or a set of associated physical signals. If a particular type of file storage format and/or syntax, for example, is intended, it is referenced expressly. It is further noted an association of memory states, for example, may be in a logical sense and not necessarily in a tangible, physical sense. Thus, although signal and/or state components of a file and/or an electronic document, for example, are to be associated logically, storage thereof, for example, may reside in one or more different places in a tangible, physical memory, in an embodiment.

A Hyper Text Markup Language ("HTML"), for example, may be utilized to specify digital content and/or to specify a format thereof, such as in the form of an electronic file and/or an electronic document, such as a Web page, Web site, etc., for example. An Extensible Markup Language ("XML") may also be utilized to specify digital content and/or to specify a format thereof, such as in the form of an electronic file and/or an electronic document, such as a Web page, Web site, etc., in an embodiment. Of course, HTML and/or XML are merely examples of "markup" languages, provided as non-limiting illustrations. Furthermore. HTML and/or XML are intended to refer to any version, now known and/or to be later developed, of these languages. Likewise, claimed subject matter are not intended to be limited to examples provided as illustrations, of course.

In the context of the present disclosure, the term "Web site" and/or similar terms refer to Web pages that are associated electronically to form a particular collection thereof. Also, in the context of the present disclosure, "Web page" and/or similar terms refer to an electronic file and/or an electronic document accessible via a network, including by specifying a uniform resource locator (URL) for accessibility via the Web, in an example embodiment. As alluded to above, in one or more embodiments, a Web page may comprise digital content coded (e.g., via computer instructions) using one or more languages, such as, for example, markup languages, including HTML and/or XML, although claimed subject matter is not limited in scope in this respect. Also, in one or more embodiments, application developers may write code (e.g., computer instructions) in the form of JavaScript (or other programming languages), for example, executable by a computing device to provide digital content to populate an electronic document and/or an electronic file in an appropriate format, such as for use in a particular application, for example. Use of the term "JavaScript" and/or similar terms intended to refer to one or more particular programming languages are intended to refer to any version of the one or more programming languages identified, now known and/or to be later developed. Thus, JavaScript is merely an example programming language. As was mentioned, claimed subject matter is not intended to be limited to examples and/or illustrations.

In the context of the present disclosure, the terms "entry," "electronic entry," "document," "electronic document," "content,", "digital content," "item," and/or similar terms are meant to refer to signals and/or states in a physical format, such as a digital signal and/or digital state format, e.g., that may be perceived by a user if displayed, played, tactilely generated, etc. and/or otherwise executed by a device, such as a digital device, including, for example, a computing device, but otherwise might not necessarily be readily perceivable by humans (e.g., if in a digital format). Likewise, in the context of the present disclosure, digital content provided to a user in a form so that the user is able to readily perceive the underlying content itself (e.g., content presented in a form consumable by a human, such as hearing audio, feeling tactile sensations and/or seeing images, as examples) is referred to, with respect to the user, as "consuming" digital content, "consumption" of digital content, "consumable" digital content and/or similar terms. For one or more embodiments, an electronic document and/or an electronic file may comprise a Web page of code (e.g., computer instructions) in a markup language executed or to be executed by a computing and/or networking device, for example. In another embodiment, an electronic document and/or electronic file may comprise a portion and/or a region of a Web page. However, claimed subject matter is not intended to be limited in these respects.

Also, for one or more embodiments, an electronic document and/or electronic file may comprise a number of components. As previously indicated, in the context of the present disclosure, a component is physical, but is not necessarily tangible. As an example, components with reference to an electronic document and/or electronic file, in one or more embodiments, may comprise text, for example, in the form of physical signals and/or physical states (e.g., capable of being physically displayed and/or maintained as a memory state in a tangible memory). Typically, memory states, for example, comprise tangible components, whereas physical signals are not necessarily tangible, although signals may become (e.g., be made) tangible, such as if appearing on a tangible display, for example, as is not uncommon. Also, for one or more embodiments, components with reference to an electronic document and/or electronic file may comprise a graphical object, such as, for example, an image, such as a digital image, and/or sub-objects, including attributes thereof, which, again, comprise physical signals and/or physical states (e.g., capable of being tangibly displayed and/or maintained as a memory state in a tangible memory). In an embodiment, digital content may comprise, for example, text, images, audio, video, haptic content and/or other types of electronic documents and/or electronic files, including portions thereof, for example.

Also, in the context of the present disclosure, the term parameters (e.g., one or more parameters) refer to material descriptive of a collection of signal samples, such as one or more electronic documents and/or electronic files, and exist in the form of physical signals and/or physical states, such as memory states. For example, one or more parameters, such as referring to an electronic document and/or an electronic file comprising an image, may include, as examples, time of day at which an image was captured, latitude and longitude of an image capture device, such as a camera, for example, etc. In another example, one or more parameters relevant to digital content, such as digital content comprising a technical article, as an example, may include one or more authors, for example. Claimed subject matter is intended to embrace meaningful, descriptive parameters in any format, so long as the one or more parameters comprise physical signals and/or states, which may include, as parameter examples, collection name (e.g., electronic file and/or electronic document identifier name), technique of creation, purpose of creation, time and date of creation, logical path if stored, coding formats (e.g., type of computer instructions, such as a markup language) and/or standards and/or specifications used so as to be protocol compliant (e.g., meaning substantially compliant and/or substantially compatible) for one or more uses, and so forth.

Signal packet communications and/or signal frame communications, also referred to as signal packet transmissions and/or signal frame transmissions (or merely "signal packets" or "signal frames"), may be communicated between nodes of a network, where a node may comprise one or more network devices and/or one or more computing devices, for example. As an illustrative example, but without limitation, a node may comprise one or more sites employing a local network address, such as in a local network address space. Likewise, a device, such as a network device and/or a computing device, may be associated with that node. It is also noted that in the context of this disclosure, the term "transmission" is intended as another term for a type of signal communication that may occur in any one of a variety of situations. Thus, it is not intended to imply a particular directionality of communication and/or a particular initiating end of a communication path for the "transmission" communication. For example, the mere use of the term in and of itself is not intended, in the context of the present disclosure, to have particular implications with respect to the one or more signals being communicated, such as, for example, whether the signals are being communicated "to" a particular device, whether the signals are being communicated "from" particular device, and/or regarding which end of a communication path may be initiating communication, such as, for example, in a "push type" of signal transfer or in a "pull type" of signal transfer. In the context of the present disclosure, push and/or pull type signal transfers are distinguished by which end of a communications path initiates signal transfer.

Thus, a signal packet and/or frame may, as an example, be communicated via a communication channel and/or a communication path, such as comprising a portion of the Internet and/or the Web, from a site via an access node coupled to the Internet or vice-versa. Likewise, a signal packet and/or frame may be forwarded via network nodes to a target site coupled to a local network, for example. A signal packet and/or frame communicated via the Internet and/or the Web, for example, may be routed via a path, such as either being "pushed" or "pulled," comprising one or more gateways, servers, etc. that may, for example, route a signal packet and/or frame, such as, for example, substantially in accordance with a target and/or destination address and availability of a network path of network nodes to the target and/or destination address. Although the Internet and/or the Web comprise a network of interoperable networks, not all of those interoperable networks are necessarily available and/or accessible to the public.

In the context of the particular disclosure, a network protocol, such as for communicating between devices of a network, may be characterized, at least in part, substantially in accordance with a layered description, such as the so-called Open Systems Interconnection (OSI) seven layer type of approach and/or description. A network computing and/or communications protocol (also referred to as a network protocol) refers to a set of signaling conventions, such as for communication transmissions, for example, as may take place between and/or among devices in a network. In the context of the present disclosure, the term "between" and/or similar terms are understood to include "among" if appropriate for the particular usage and vice-versa. Likewise, in the context of the present disclosure, the terms "compatible with," "comply with" and/or similar terms are understood to respectively include substantial compatibility and/or substantial compliance.

A network protocol, such as protocols characterized substantially in accordance with the aforementioned OSI description, has several layers. These layers are referred to as a network stack. Various types of communications (e.g., transmissions), such as network communications, may occur across various layers. A lowest level layer in a network stack, such as the so-called physical layer, may characterize how symbols (e.g., bits and/or bytes) are communicated as one or more signals (and/or signal samples) via a physical medium (e.g., twisted pair copper wire, coaxial cable, fiber optic cable, wireless air interface, combinations thereof, etc.). Progressing to higher-level layers in a network protocol stack, additional operations and/or features may be available via engaging in communications that are substantially compatible and/or substantially compliant with a particular network protocol at these higher-level layers. For example, higher-level layers of a network protocol may, for example, affect device permissions, user permissions, etc.

A network and/or sub-network, in an embodiment, may communicate via signal packets and/or signal frames, such via participating digital devices and may be substantially compliant and/or substantially compatible with, but is not limited to, now known and/or to be developed, versions of any of the following network protocol stacks: ARCNET, AppleTalk, ATM, Bluetooth, DECnet, Ethernet, FDDI, Frame Relay, HIPPI, IEEE 1394, IEEE 802.11, IEEE-488, Internet Protocol Suite, IPX, Myrinet, OSI Protocol Suite, QsNet, RS-232, SPX, System Network Architecture, Token Ring, USB, and/or X.25. A network and/or sub-network may employ, for example, a version, now known and/or later to be developed, of the following: TCP/IP, UDP, DECnet, NetBEUI, IPX, AppleTalk and/or the like. Versions of the Internet Protocol (IP) may include IPv4, IPv6, and/or other later to be developed versions.

Regarding aspects related to a network, including a communications and/or computing network, a wireless network may couple devices, including client devices, with the network. A wireless network may employ stand-alone, ad-hoc networks, mesh networks, Wireless LAN (WLAN) networks, cellular networks, and/or the like. A wireless network may further include a system of terminals, gateways, routers, and/or the like coupled by wireless radio links, and/or the like, which may move freely, randomly and/or organize themselves arbitrarily, such that network topology may change, at times even rapidly. A wireless network may further employ a plurality of network access technologies, including a version of Long Term Evolution (LTE), WLAN, Wireless Router (WR) mesh, 2nd, 3rd, or 4th generation (2G, 3G, or 4G) cellular technology and/or the like, whether currently known and/or to be later developed. Network access technologies may enable wide area coverage for devices, such as computing devices and/or network devices, with varying degrees of mobility, for example.

A network may enable radio frequency and/or other wireless type communications via a wireless network access technology and/or air interface, such as Global System for Mobile communication (GSM), Universal Mobile Telecommunications System (UMTS), General Packet Radio Services (GPRS), Enhanced Data GSM Environment (EDGE), 3GPP Long Term Evolution (LTE), LTE Advanced, Wideband Code Division Multiple Access (WCDMA), Bluetooth, ultra-wideband (UWB), IEEE 802.11 (including, but not limited to, IEEE 802.11b/g/n), and/or the like. A wireless network may include virtually any type of now known and/or to be developed wireless communication mechanism and/or wireless communications protocol by which signals may be communicated between devices, between networks, within a network, and/or the like, including the foregoing, of course.

Figure 14:
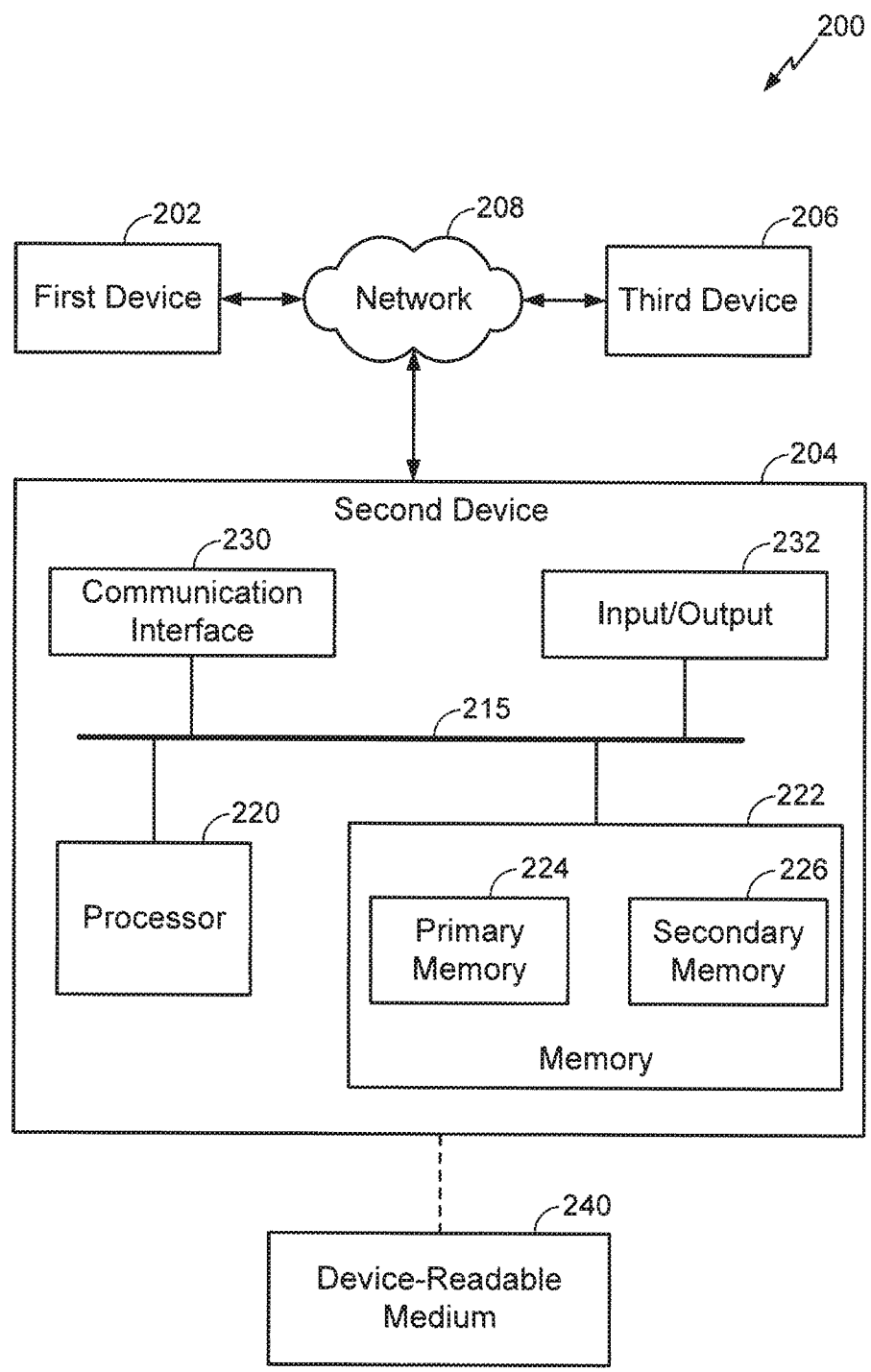
FIG. 14 is a schematic diagram showing embodiments of computing devices, such as may be used for a control system, such as to guide an embodiment of a process to synthesize zinc oxide.

In one example embodiment, as shown in FIG. 14, a system embodiment may comprise a local network (e.g., device 204 and medium 240) and/or another type of network, such as a computing and/or communications network.

For purposes of illustration, therefore, FIG. 14 shows an embodiment 200 of a system that may be employed to implement either type or both types of networks. Network 208 may comprise one or more network connections, links, processes, services, applications, and/or resources to facilitate and/or support communications, such as an exchange of communication signals, for example, between a computing device, such as 202, and another computing device; such as 206, which may, for example, comprise one or more client computing devices and/or one or more server computing device. By way of example, but not limitation, network 208 may comprise wireless and/or wired communication links, telephone and/or telecommunications systems; Wi-Fi networks, Wi-MAX networks, the Internet, a local area network (LAN), a wide area network (WAN), or any combinations thereof.

Example devices in FIG. 14 may comprise features, for example, of a client computing device and/or a server computing device, in an embodiment. It is further noted that the term computing device may be employed to implement a control system, as previously discussed and refers at least to a processor and a memory connected by a communication bus. Likewise, in the context of the present disclosure at least, this is understood to refer to sufficient structure within the meaning of 35 § USC 112 (f) so that it is specifically intended that 35 § USC 112 (f) not be implicated by use of the term "control system," "computing device," and/or similar terms; however, if it is determined, for some reason not immediately apparent, that the foregoing understanding cannot stand and that 35 § USC 112 (f) therefore, necessarily is implicated by the use of these and/or similar terms, then, it is intended, pursuant to that statutory section, that corresponding structure, material and/or acts for performing one or more functions be understood and be interpreted to be described at least in FIGS. 4-13 and the associated paragraphs of the present disclosure.

Referring now to FIG. 14, in an embodiment, first and third devices 202 and 206 may be capable of rendering a graphical user interface (GUI) for a network device and/or a computing device, for example, so that a user-operator may engage in system use. Device 204 may potentially serve a similar function in this illustration. Likewise, in FIG. 14, computing device 202 ('first device' in figure) may interface with computing device 204 ('second device' in figure), which may, for example, also comprise features of a client computing device and/or a server computing device, in an embodiment. Processor (e.g., processing device) 220 and memory 222, which may comprise primary memory 224 and secondary memory 226, may communicate by way of a communication bus 215, for example. The term "computing device," in the context of the present disclosure, refers to a system and/or a device, such as a computing apparatus, that includes a capability to process (e.g., perform computations) and/or store digital content, such as electronic files, electronic documents, measurements, text, images, video, audio, etc. in the form of signals and/or states. Thus, a computing device, in the context of the present disclosure, may comprise hardware, software, firmware, or any combination thereof (other than software per se). Computing device 204, as depicted in FIG. 14, is merely one example, and claimed subject matter is not limited in scope to this particular example.

For one or more embodiments, a computing device may comprise, for example, any of a wide range of digital electronic devices, including, but not limited to, desktop and/or notebook computers, cellular telephones, tablet devices, wearable devices, personal digital assistants, or any combination of the foregoing. Further, unless specifically stated otherwise, a process as described, such as with reference to flow diagrams and/or otherwise, may also be executed and/or affected, in whole or in part, by a computing device and/or a network device. A device, such as a computing device and/or network device, may vary in terms of capabilities and/or features. Claimed subject matter is intended to cover a wide range of potential variations. For example, a device may include a web-enabled device including a physical and/or a virtual keyboard, mass storage, one or more accelerometers, one or more gyroscopes, global positioning system (GPS) and/or other location-identifying type capability, and/or a display with a higher degree of functionality, such as a touch-sensitive color 2D or 3D display, for example.

As suggested previously, communications between a computing device and/or a network device and a wireless network may be in accordance with known and/or to be developed network protocols including, for example, global system for mobile communications (GSM), enhanced data rate for GSM evolution (EDGE), 802.11b/g/n/h, etc., and/or worldwide interoperability for microwave access (WiMAX). A computing device and/or a networking device may also have a subscriber identity module (SIM) card, which, for example, may comprise a detachable or embedded smart card that is able to store subscription content of a user, and/or is also able to store a contact list. A user may own the computing device and/or network device or may otherwise be a user, such as a primary user, for example. A device may be assigned an address by a wireless network operator, a wired network operator, and/or an Internet Service Provider (ISP). For example, an address may comprise a domestic or international telephone number, an Internet Protocol (IP) address, and/or one or more other identifiers. In other embodiments, a computing and/or communications network may be embodied as a wired network, wireless network, or any combinations thereof.

A computing and/or network device may include and/or may execute a variety of now known and/or to be developed operating systems, derivatives and/or versions thereof, including computer operating systems, such as Windows, iOS, Linux, a mobile operating system, such as iOS, Android, Windows Mobile, and/or the like. A computing device and/or network device may include and/or may execute a variety of possible applications, such as a client software application enabling communication with other devices. For example, one or more messages (e.g., content) may be communicated, such as via one or more protocols, now known and/or later to be developed, suitable for communication of email, short message service (SMS), and/or multimedia message service (MMS), including via a network. A computing and/or network device may also include executable computer instructions to process and/or communicate digital content, such as, for example, textual content, digital multimedia content, and/or the like. A computing and/or network device may also include executable computer instructions to perform a variety of possible tasks, such as browsing, searching, playing various forms of digital content, including locally stored and/or streamed video, and/or games such as, but not limited to, fantasy sports leagues. The foregoing is provided merely to illustrate that claimed subject matter is intended to include a wide range of possible features and/or capabilities.

In FIG. 14, computing device 202 may provide one or more sources of executable computer instructions in the form physical states and/or signals (e.g., stored in memory states), for example. Computing device 202 may communicate with computing device 204 by way of a network connection, such as via network 208, for example. As previously mentioned, a connection, while physical, may not necessarily be tangible. Although computing device 204 of FIG. 14 shows various tangible, physical components, claimed subject matter is not limited to a computing devices having only these tangible components as other implementations and/or embodiments may include alternative arrangements that may comprise additional tangible components or fewer tangible components, for example, that function differently while achieving similar results. Rather, examples are provided merely as illustrations. It is not intended that claimed subject matter be limited in scope to illustrative examples.

Memory 222 may comprise any non-transitory storage mechanism. Memory 222 may comprise, for example, primary memory 224 and secondary memory 226, additional memory circuits, mechanisms, or combinations thereof may be used. Memory 222 may comprise, for example, random access memory, read only memory, etc., such as in the form of one or more storage devices and/or systems, such as, for example, a disk drive including an optical disc drive, a tape drive, a solid-state memory drive, etc., just to name a few examples.

Memory 222 may be utilized to store a program of executable computer instructions. For example, processor 220 may fetch executable instructions from memory and proceed to execute the fetched instructions. Memory 222 may also comprise a memory controller for accessing device readable-medium 240 that may carry and/or make accessible digital content, which may include code, and/or instructions, for example, executable by processor 220 and/or some other device, such as a controller, as one example, capable of executing computer instructions, for example. Under direction of processor 220, a non-transitory memory, such as memory cells storing physical states (e.g., memory states), comprising, for example, a program of executable computer instructions, may be executed by processor 220 and able to generate signals to be communicated via a network, for example, as previously described. Generated signals may also be stored in memory, also previously suggested.

Memory 222 may store electronic files and/or electronic documents, such as relating to one or more users, and may also comprise a device-readable medium that may carry and/or make accessible content, including code and/or instructions, for example, executable by processor 220 and/or some other device, such as a controller, as one example, capable of executing computer instructions, for example. As previously mentioned, the term electronic file and/or the term electronic document are used throughout this document to refer to a set of stored memory states and/or a set of physical signals associated in a manner so as to thereby form an electronic file and/or an electronic document. That is, it is not meant to implicitly reference a particular syntax, format and/or approach used, for example, with respect to a set of associated memory states and/or a set of associated physical signals. It is further noted an association of memory states, for example, may be in a logical sense and not necessarily in a tangible, physical sense. Thus, although signal and/or state components of an electronic file and/or electronic document, are to be associated logically, storage thereof, for example, may reside in one or more different places in a tangible, physical memory, in an embodiment.

Algorithmic descriptions and/or symbolic representations are examples of techniques used by those of ordinary skill in the signal processing and/or related arts to convey the substance of their work to others skilled in the art. An algorithm is, in the context of the present disclosure, and generally, is considered to be a self consistent sequence of operations and/or similar signal processing leading to a desired result. In the context of the present disclosure, operations and/or processing involve physical manipulation of physical quantities. Typically, although not necessarily, such quantities may take the form of electrical and/or magnetic signals and/or states capable of being stored, transferred, combined, compared, processed and/or otherwise manipulated, for example, as electronic signals and/or states making up components of various forms of digital content, such as signal measurements, text, images, video, audio, etc.

It has proven convenient at times, principally for reasons of common usage, to refer to such physical signals and/or physical states as bits, values, elements, parameters, symbols, characters, terms, numbers, numerals, measurements, content and/or the like. It should be understood, however, that all of these and/or similar terms are to be associated with appropriate physical quantities and are merely convenient labels. Unless specifically stated otherwise, as apparent from the preceding discussion, it is appreciated that throughout this specification discussions utilizing terms such as "processing," "computing," "calculating," "determining", "establishing", "obtaining", "identifying", "selecting", "generating", and/or the like may refer to actions and/or processes of a specific apparatus, such as a special purpose computer and/or a similar special purpose computing and/or network device. In the context of this specification, therefore, a special purpose computer and/or a similar special purpose computing and/or network device is capable of processing, manipulating and/or transforming signals and/or states, typically in the form of physical electronic and/or magnetic quantities, within memories, registers, and/or other storage devices, processing devices, and/or display devices of the special purpose computer and/or similar special purpose computing and/or network device. In the context of this particular disclosure, as mentioned, the term "specific apparatus" therefore includes a general purpose computing and/or network device, such as a general purpose computer, once it is programmed to perform particular functions, such as pursuant to program software instructions.

In some circumstances, operation of a memory device, such as a change in state from a binary one to a binary zero or vice-versa, for example, may comprise a transformation, such as a physical transformation. With particular types of memory devices, such a physical transformation may comprise a physical transformation of an article to a different state or thing. For example, but without limitation, for some types of memory devices, a change in state may involve an accumulation and/or storage of charge or a release of stored charge. Likewise, in other memory devices, a change of state may comprise a physical change, such as a transformation in magnetic orientation. Likewise, a physical change may comprise a transformation in molecular structure, such as from crystalline form to amorphous form or vice-versa. In still other memory devices, a change in physical state may involve quantum mechanical phenomena, such as, superposition, entanglement, and/or the like, which may involve quantum bits (qubits), for example. The foregoing is not intended to be an exhaustive list of all examples in which a change in state from a binary one to a binary zero or vice-versa in a memory device may comprise a transformation, such as a physical, but non-transitory, transformation. Rather, the foregoing is intended as illustrative examples.

Referring again to FIG. 14, processor 220 may comprise one or more circuits, such as digital circuits, to perform at least a portion of a computing procedure and/or process. By way of example, but not limitation, processor 220 may comprise one or more processors, such as controllers, microprocessors, microcontrollers, application specific integrated circuits, digital signal processors, programmable logic devices, field programmable gate arrays, the like, or any combination thereof. In various implementations and/or embodiments, processor 220 may perform signal processing, typically substantially in accordance with fetched executable computer instructions, such as to manipulate signals and/or states, to construct signals and/or states, etc., with signals and/or states generated in such a manner to be communicated and/or stored in memory, for example.

FIG. 14 also illustrates device 204 as including a component 232 operable with input/output devices, for example, so that signals and/or states may be appropriately communicated between devices, such as device 204 and an input device and/or device 204 and an output device. A user may make use of an input device, such as a computer mouse, stylus, track ball, keyboard, and/or any other similar device capable of receiving user actions and/or motions as input signals. Likewise, a user may make use of an output device, such as a display, a printer, etc., and/or any other device capable of providing signals and/or generating stimuli for a user, such as visual stimuli, audio stimuli and/or other similar stimuli.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

The invention claimed is:

1. An apparatus comprising:
   a wafer substrate holder; and
   a fluid sealable chamber enclosure;
   a first valve external to the fluid sealable chamber enclosure;
   a second valve external to the fluid sealable chamber enclosure;
   the fluid sealable chamber enclosure having a cylindrical-like shaped cavity sized to entirely enclose the wafer substrate holder so that the wafer substrate holder does not move in a lateral direction or in a vertical direction within the chamber enclosure during operation;
   the fluid sealable chamber enclosure having an enclosure door capable of being opened to allow the wafer substrate holder to be inserted or removed from the fluid sealable chamber enclosure;
   wherein the enclosure door forms a fluid tight seal in a closed position;
   the wafer substrate holder to be received within the chamber enclosure in a manner to position a plurality of wafer substrates so that flat surfaces thereof are substantially mutually parallel to an end of the fluid sealable chamber enclosure;
   a drive motor to engage with and rotate the wafer substrate holder in a manner to mix contents within the fluid sealable chamber with the contents being completely enclosed within the fluid sealable chamber and completely filling the chamber enclosure cavity with the fluid tight seal being maintained and capable of holding a material that is a liquid without leaking;

the chamber enclosure is connected to a programmable closed loop fluid handling system in which the programmable closed loop fluid handling system is programmed to implement an aqueous solution zinc oxide growth process and so that fluids are to be received in the fluid sealable chamber enclosure via at least one input port while the first valve is opened before a growth cycle of the aqueous solution zinc oxide growth process, the first valve is closed to stop flow of the fluids, the wafer substrate holder is rotated relative to the fluid sealable chamber enclosure about a horizontal axis of rotation oriented at a perpendicular angle with respect to a vertical axis of rotation as part of the growth cycle of the aqueous solution zinc oxide growth process, and so that fluids are to be removed from the fluid sealable chamber enclosure via at least one output port after the growth cycle of the aqueous solution zinc oxide growth process and after the second valve is opened, and wherein the vertical axis is parallel to the flat surfaces of the plurality of wafer substrates, and wherein zinc oxide (ZnO) crystals are grown on a surface of the plurality of wafer substrates during the zinc oxide growth process.

2. The apparatus of claim 1, wherein the wafer substrate holder is configured to rotate in a manner in which the wafer substrate holder rotates about an axis of rotation approximately passing through a center of the plurality of wafer substrates, the wafer substrates to be arranged in the wafer substrate holder to be axially aligned.

3. The apparatus of claim 1, wherein the wafer substrate holder comprises a structure in which the wafer substrate holder is to be positioned within the chamber enclosure in a manner so that, during rotation, the fluids are able to flow within the chamber enclosure so as to as to continually mix the fluids via action resulting from rotating movement and to contact the flat surfaces of the plurality of wafer substrates and to flow around and between the wafer substrates to contact the flat surfaces of the wafer substrates.

4. The apparatus of claim 1, wherein the wafer substrate holder is to engage with the drive motor via a drive arm connector or drive arm rotor constructed to mate with the wafer substrate holder during drive operation so that the wafer substrate holder is able to rotate while the chamber enclosure remains stationary and is able to disengage to allow removal of the wafer substrate holder from the chamber enclosure.

5. The apparatus of claim 4, wherein the drive motor comprises the drive arm; and wherein the drive arm connector or drive arm rotor is connected to a mechanical drive motor to rotate the drive arm via an opening in an end of the chamber enclosure; wherein the opening in the end of the chamber enclosure is able to maintain a fluid tight seal during operation of the mechanical drive motor.

6. The apparatus of claim 1, wherein the wafer substrate holder is configured to engage with the drive motor, the drive motor comprising a magnetic drive mechanism.

7. The apparatus of claim 1, wherein the plurality of wafer substrates is to be held in place in the wafer substrate holder via geometric features to mate with an edge of respective wafer substrates of the plurality of wafer substrates.

8. The apparatus of claim 7, wherein the geometric features comprise grooves.

9. The apparatus of claim 7, wherein the plurality of wafer substrates is to be positioned in the wafer substrate holder so that flat surfaces of the wafer substrates are substantially mutually parallel and are substantially mutually parallel to the end of the fluid sealable chamber enclosure.

10. The apparatus of claim 1, wherein the fluids within the chamber enclosure are to be heated via heat transfer between a thermally conductive shell and an inner chamber wall of the chamber enclosure.

11. The apparatus of claim 1, wherein the fluids within the chamber enclosure are to be heated via absorption of a source of radiation.

12. The apparatus of claim 11, wherein the source of radiation comprises a source of microwave radiation.

13. The apparatus of claim 1, wherein the programmable closed loop fluid handling system comprises an interconnected network of fluid lines, fluid valves, one or more process parameter sensors, one or more pressure vessels, one or more fluid pumps, one or more fluid sources, one or more fluid drains and the programmable controller controls at least partially the interconnected network of fluid lines, fluid valves, one or more process parameter sensors, one or more pressure vessels, one or more fluid pumps, one or more fluid sources, and one or more fluid drains to implement, via programming, the aqueous solution zinc oxide growth process in which one or more parameters of the process are able to be modified in a set manner, the one or more parameters of the process capable of being modified in the set manner including rate of rotation, time of rotation, temperature during rotation, pressure during rotation, rate of receiving growth solution, and rate of removing growth solution.

14. The apparatus of claim 1, further comprising a third valve, the third valve to be opened after the zinc oxide growth process is completed, the programmable closed loop fluid handling system programmed to select between implementing a liquid rinse process by opening the third valve and the first valve, or alternatively implementing a gas purge process by opening the third valve and the first valve.

15. The apparatus of claim 14, further comprising a fourth valve, the fourth valve to be opened after zinc oxide growth process is completed, the programmable closed loop fluid handling system programmed to implement a cleaning process by closing the third valve and by opening the fourth valve and the first valve to supply an acid cleaning solution.

16. The apparatus of claim 1, further comprising a third valve, a fourth valve and an integrated flow controller, the programmable closed loop fluid handling system programmed to 1) implement the aqueous solution zinc oxide growth process at a higher flow rate by selecting a bypass line at the fourth valve to supply the liquids at a higher rate and opening the third valve and the first valve or 2) to implement the aqueous solution zinc oxide growth process at a lower rate by selecting an integrated flow controller at the fourth valve to supply the liquids at the lower rate and by opening the third valve and the first valve.

17. The apparatus of claim 1, further comprising a pressurized vessel, a growth solution pump, and a growth solution source, the programmable closed loop fluid handling system programmed to 1) pressurize the liquids at an atmospheric pressure in the fluid sealable chamber enclosure; and 2) supply the liquids of the growth solution source through the pressurized vessel to the fluid sealable chamber enclosure utilizing the growth solution pump and by opening the first valve.

18. The apparatus of claim 17, further comprising a filter outside the pressurized vessel and the growth solution source, the filter to filter contaminants after the liquids have passed through the pressurized vessel.

\* \* \* \* \*